United States Patent
Aoyagi

(10) Patent No.: US 9,318,522 B2
(45) Date of Patent: Apr. 19, 2016

(54) COLORED RADIATION-SENSITIVE COMPOSITION FOR COLOR FILTER, PATTERN FORMING METHOD, COLOR FILTER AND METHOD OF PRODUCING THE SAME, AND SOLID-STATE IMAGE SENSOR

(71) Applicant: FUJIFILM Corporation, Minato-ku, Tokyo (JP)

(72) Inventor: Kaoru Aoyagi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/148,076

(22) Filed: Jan. 6, 2014

(65) Prior Publication Data

US 2014/0120473 A1    May 1, 2014

Related U.S. Application Data

(63) Continuation of application No. PCT/JP2012/072666, filed on Aug. 30, 2012.

(30) Foreign Application Priority Data

Sep. 14, 2011   (JP) ................. 2011-200624

(51) Int. Cl.
```
G02B 5/20       (2006.01)
G03F 7/004      (2006.01)
H01L 27/146     (2006.01)
G03F 7/031      (2006.01)
G02B 5/22       (2006.01)
G02B 5/23       (2006.01)
G03F 7/00       (2006.01)
G03F 7/105      (2006.01)
G03F 7/027      (2006.01)
```

(52) U.S. Cl.
CPC ............ *H01L 27/14621* (2013.01); *G02B 5/20* (2013.01); *G02B 5/201* (2013.01); *G02B 5/223* (2013.01); *G02B 5/23* (2013.01); *G03F 7/0007* (2013.01); *G03F 7/031* (2013.01); *G03F 7/105* (2013.01); *H01L 27/14685* (2013.01); *G03F 7/027* (2013.01)

(58) Field of Classification Search
CPC ....... G03F 7/0007; G03F 7/027; G03F 7/031; G03F 7/105; G02F 5/223
USPC ............................ 430/7, 270.1; 257/432, 440
See application file for complete search history.

(56) References Cited

U.S. PATENT DOCUMENTS

2007/0187794 A1    8/2007   Fukuyoshi et al.

FOREIGN PATENT DOCUMENTS

| CN | 101044622 A | 9/2007 |
| JP | 7-28236 A | 1/1995 |
| JP | 2007-036545 A | * 2/2007 |
| JP | 2007-138135 A | 6/2007 |
| JP | 2010-224308 A | * 10/2010 |
| KR | 10-2007-0088483 A | 8/2007 |

OTHER PUBLICATIONS

Computer-generated translation of JP 2007-036545 (Feb. 2007).*
Computer-generated translation of JP 2010-224308 (Oct. 2010).*
International Search Report for PCT/JP2012/072666 dated Dec. 11, 2012, 3 pages.
Written Opinion for PCT/JP2012/072666 dated Dec. 11, 2012, 4 pages.
Extended European Search Report dated Mar. 31, 2015, issued by the European Patent Office in counterpart EP Application No. 12831102.4.
Office Action dated Oct. 8, 2015 from the Korean Intellectual Property Office issued in counterpart Korean Application No. 10-2013-7033554.
Office Action dated Nov. 19, 2015 from the Taiwanese Intellectual Property Office issued in corresponding Taiwanese Application No. 101131567.
Office Action dated Feb. 5, 2016 from the Korean Intellectual Property Office in counterpart Korean Application No. 10-2013-7033554.

* cited by examiner

*Primary Examiner* — John A McPherson
(74) *Attorney, Agent, or Firm* — Sughrue Mion, PLLC

(57) ABSTRACT

A colored radiation-sensitive composition for a color filter that includes (A) a pigment, (B) a photopolymerization initiator, and (C) a polymerizable compound, in which the colored radiation-sensitive composition satisfies the following conditions: when a colored radiation-sensitive composition layer is formed from the colored radiation-sensitive composition such that spectral transmittance at 600 nm becomes 30%, the colored radiation-sensitive composition layer includes the following characteristics: (1) spectral transmittance at 400 nm is 20% or less; (2) spectral transmittance at 550 nm is 10% or less; (3) spectral transmittance at 700 nm is 70% or more; (4) a wavelength resulting in 50% spectral transmittance is in a range of from 650 nm to 680 nm; and (5) a film thickness of the colored radiation-sensitive composition layer is in a range of from 0.55 μm to 1.8 μm.

32 Claims, No Drawings

COLORED RADIATION-SENSITIVE COMPOSITION FOR COLOR FILTER, PATTERN FORMING METHOD, COLOR FILTER AND METHOD OF PRODUCING THE SAME, AND SOLID-STATE IMAGE SENSOR

CROSS-REFERENCE TO RELATED APPLICATIONS

This application is a continuation application of International Application No. PCT/JP/2012/072666, filed Aug. 30, 2012, the disclosure of which is incorporated herein by reference in its entirety. Further, this application claims priority from Japanese Patent Application No. 2011-200624, filed Sep. 14, 2011, the disclosure of which is incorporated herein by reference in its entirety.

TECHNICAL FIELD

The invention relates to a colored radiation-sensitive composition for a color filter, a pattern forming method, a color filter and a method of producing the color filter, and a solid-state image sensor

BACKGROUND ART

Color filters are essential components of solid-state image sensors and liquid crystal displays. Improvement in color separation and improvement in color reproducibility are required for a color filter for a solid-state image sensor, in particular.

These color filters have a colored region with multiple hues (that is, a colored cured film), and usually have colored regions of at least red, green, and blue colors (hereinafter, may be referred to as "color patterns", or "colored pixels"). A method for forming such a color patterns is as follows. First, a colored radiation-sensitive composition containing any of red, green and blue colorants are applied by coating to provide a first hue, and the colored radiation-sensitive composition is then exposed to light and developed, and subjected to a heat treatment as needed, to form a color pattern having the first hue. Next, similar coating, exposure and development processes, and a heat treatment as needed, are repeated with respect to a second hue and a third hue, respectively.

As a colorant used for a color filter, pigments are widely used since they have a vivid tone and high coloring power. In particular, a pigment which is micronized and exhibits suitable color separation properties is preferably used.

Recently, for solid-state image sensors, colored pixels with reduced size (for example, a color pattern having a side length of 1.0 µm or less) have been sought after for the purpose of improving resolution. However, it is known that, in solid-state image sensors, deterioration caused by noise is associated with the reduction in size of colored pixels.

A solid-state image sensor is used as an optical sensor for a variety of purposes.

For example, since near-infrared light has a longer wavelength than visible light and thus tends not to scatter, it can be utilized for distance measurement, three-dimensional measurement, and the like. In addition, since near-infrared light is invisible to humans, animals and the like, it is not noticed by subjects even when the subject is illuminated with a near-infrared light source at night. Therefore, near-infrared light can be used to take photos of nocturnal wild animals, as well as to photograph persons without provoking them for security purposes. Optical sensors detecting such near-infrared light can be developed for various purposes, and thus there has been a persistent desire to develop a color filter that can be used for solid-state image sensors that detect near-infrared light.

As a colored composition for producing a color filter having similar spectral characteristics to that of a color filter for near-infrared sensors, a red colored composition containing C.I. Pigment Violet 23, a yellow pigment, and a red pigment is known (for example, see Japanese Patent Application Laid-Open (JP-A) No. 2007-138135). Although this composition is effective for illuminance sensors, it also has sensitivity in the red region. In addition, this composition does not enable favorable pattern formation by UV light exposure, since light in the UV region is blocked. Thus, for near-infrared sensors, further improvements in the spectral characteristics and pattern formability of the composition are required.

In addition, a light-shielding photosensitive resin composition that transmits light in the ultraviolet region and exhibits improved pattern formability has been proposed (for example, see JP-A No. 7-28236). This composition, however, exhibits insufficient light-transmission properties in the near-infrared region, so that it has not been useful for near-infrared sensors.

SUMMARY OF INVENTION

The invention was made in view of the above circumstances, and to achieve the following objects.

Specifically, an object of the invention is to provide a colored radiation-sensitive composition having sufficient light-shielding properties in the visible light region of from 400 nm to 580 nm, and having excellent light-transmission properties in the near-infrared region of from 650 nm to 700 nm, and achieving good pattern formability when used for producing a color filter.

Other objects of the invention are to provide a method for forming a pattern using the colored radiation-sensitive composition, to provide a color filter including a color film formed by using the colored radiation-sensitive composition and a method for producing the color filter, and to provide a solid-state image sensor including the color filter.

As a result of intensive research, the inventor has discovered that the above-mentioned objects could be accomplished by using a colored radiation-sensitive composition for a color filter including (A) a pigment, (B) a photopolymerization initiator, and (C) a polymerizable compound, in which the colored radiation-sensitive composition satisfies the condition that, when a colored radiation-sensitive composition layer is formed on a substrate using the colored radiation-sensitive composition, the colored radiation-sensitive composition layer exhibits a specific spectral transmittance at a specific wavelength, whereby the invention was made.

Specific aspects of the invention for solving the problems are as follows.

<1> A colored radiation-sensitive composition for a color filter including (A) a pigment, (B) a photopolymerization initiator, and (C) a polymerizable compound, in which the colored radiation-sensitive composition satisfies the following conditions:

when a colored radiation-sensitive composition layer is formed from the colored radiation-sensitive composition such that spectral transmittance at 600 nm becomes 30%, the colored radiation-sensitive composition layer includes the following characteristics:

(1) spectral transmittance at 400 nm is 20% or less;
(2) spectral transmittance at 550 nm is 10% or less;
(3) spectral transmittance at 700 nm is 70% or more;

(4) a wavelength resulting in 50% spectral transmittance is in a range of from 650 nm to 680 nm; and (5) a film thickness of the colored radiation-sensitive composition layer is in a range of from 0.55 µm to 1.8 µm.

<2> The colored radiation-sensitive composition for a color filter according to <1>, in which the colored radiation-sensitive composition layer further includes the following characteristic:

(6) a difference between spectral transmittance at 700 nm (T700) and spectral transmittance at 550 nm (T550) in the colored radiation-sensitive composition layer is 75% or more.

<3> The colored radiation-sensitive composition for a color filter according to <1> or <2>, in which (A) the pigment includes (A-1) at least one of an azo yellow pigment or an isoindoline yellow pigment and (A-2) a dioxazine violet pigment.

<4> The colored radiation-sensitive composition for a color filter according to any one of <1> to <3>, in which the content of (A-1) the at least one of an azo yellow pigment or an isoindoline yellow pigment is from 25% by mass to 50% by mass with respect to a total content of (A-1) the at least one of an azo yellow pigment or an isoindoline yellow pigment and (A-2) the dioxazine violet pigment.

<5> The colored radiation-sensitive composition for a color filter according to any one of <1> to <4>, in which the total content of (A) the pigment is from 5% by mass to 50% by mass with respect to a total solid content of the colored radiation-sensitive composition.

<6> The colored radiation-sensitive composition for a color filter according to any one of <1> to <5>, further including (D) an ultraviolet absorber, in which the content of (D) the ultraviolet absorber is from 0.01% by mass to 10% by mass with respect to a total solid content of the colored radiation-sensitive composition.

<7> The colored radiation-sensitive composition for a color filter according to <6>, in which (D) the ultraviolet absorber is a compound represented by the following Formula (I):

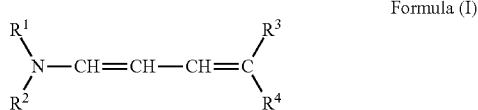

Formula (I)

wherein, in Formula (I), $R^1$ and $R^2$ each independently represent a hydrogen atom, an alkyl group having 1 to 20 carbon atoms, or an aryl group having 6 to 20 carbon atoms, $R^1$ and $R^2$ may be the same as or different from each other, but $R^1$ and $R^2$ do not simultaneously represent a hydrogen atom; and $R^3$ and $R^4$ represent an electron withdrawing group.

<8> The colored radiation-sensitive composition for a color filter according to any one of <1> to <7>, further including (E) an alkali-soluble resin.

<9> The colored radiation-sensitive composition for a color filter according to <8>, in which the content of (E) the alkali-soluble resin in the colored radiation-sensitive composition is from 1% by mass to 15% by mass with respect to a total solid content of the colored radiation-sensitive composition.

<10> The colored radiation-sensitive composition for a color filter according to any one of <1> to <9>, further including (F) an organic solvent.

<11> The colored radiation-sensitive composition for a color filter according to <10>, in which the content of (F) the organic solvent in the colored radiation-sensitive composition is from 10% by mass to 90% by mass with respect to a total mass of the colored radiation-sensitive composition.

<12> A method for forming a pattern, in which the method includes applying the colored radiation-sensitive composition according to any one of <1> to <11> onto a substrate to form a colored radiation-sensitive composition layer; subjecting the colored radiation-sensitive composition layer to pattern exposure; and developing the colored radiation-sensitive composition layer after the pattern exposure.

<13> A color filter including a color film formed using the colored radiation-sensitive composition according to any one of <1> to <11>.

<14> A method for producing a color filter, in which the method includes applying the colored radiation-sensitive composition according to any one of <1> to <11> onto a substrate to form a colored radiation-sensitive composition layer; subjecting the colored radiation-sensitive composition layer to pattern exposure; and developing the colored radiation-sensitive composition layer after the pattern exposure to form a color pattern.

<15> A solid-state image sensor including the color filter according to <13>.

The color filter obtained by using the colored radiation-sensitive composition of the invention has sufficient light-shielding properties in the visible light region of from 400 nm to 580 nm and has excellent light-transmission properties in the near-infrared region of from 650 nm to 700 nm. Therefore, using the color filter of the invention, a solid stage image sensor having sensitivity to near-infrared light can be provided. Particularly, the colored radiation-sensitive composition that includes (A-1) the at least one of an azo yellow pigment or an isoindoline yellow pigment and (A-2) the dioxazine violet pigment as (A) the pigment has sufficient light-shielding properties in the visible light region and has excellent light-transmission properties in the near-infrared region of from 650 nm to 700 nm. Therefore, a solid-state image sensor having high sensitivity to near-infrared light can be obtained using such composition. When the content of (A-1) the at least one of an azo yellow pigment or an isoindoline yellow pigment with respect to a total content of (A-1) the at least one of an azo yellow pigment or an isoindoline yellow pigment and (A-2) the dioxazine violet pigment is from 25% by mass to 50% by mass, spectral characteristics of the color filter of the invention are improved. In addition, when the colored radiation-sensitive composition further includes the ultraviolet absorber, pattern formability is significantly improved. It is assumed that, the colored radiation-sensitive composition layer blocks UV light such as i-line that is necessary for pattern formation, whereby the reduction in curability of the colored radiation-sensitive composition layer is prevented and the radiation energy absorption capacity necessary for curing the colored radiation-sensitive composition layer is improved.

When the content of (A-1) the at least one of an azo yellow pigment or an isoindoline yellow pigment with respect to a total content of (A-1) the at least one of an azo yellow pigment or an isoindoline yellow pigment and (A-2) the dioxazine violet pigment is from 25% by mass to 50% by mass, light-transmission properties in the near-infrared region of 650 nm or more together with the light-shielding properties in the visible light region of from 400 nm to 580 nm can be improved, whereby sufficient spectral performance for near-infrared sensors can be achieved. When the content of (A-1) the at least one of an azo yellow pigment or an isoindoline yellow pigment is less than 25% by mass, light-shielding properties in the wavelength region of from 600 nm to 650 nm are sufficient but significantly lowered in the wavelength region of from 400 nm to 500 nm. On the other hand, when the content of (A-1) the at least one of an azo yellow pigment or an isoindoline yellow pigment exceeds 50% by mass, light-shielding properties in the wavelength region of from 400 nm to 500 nm are sufficient but significantly lowered in the wavelength region of from 600 nm to 650 nm. In this case, since i-line transmittance is reduced, pattern formability is also lowered. The composition described in JP-A No. 2007-138135, which is used for illuminance sensors, includes a red pigment and the spectral properties thereof are designed to block light in the wavelength region of from 400 nm to 580 nm for the purpose of determining and evaluating the sensitivity within the human visibility region (the light-sensitive region of humans) based on the following calculation: transmittance in the light-sensitive region=total light transmittance−transmittance in the wavelength region longer than 580 nm. Therefore, the composition described in JP-A No. 2007-138135 is different from a composition used for sensors that transmit light in the near-infrared region (650 nm or more), which is the object of the present invention.

According to the invention, there can be provided the colored radiation-sensitive composition having sufficient light-shielding properties in the visible light region of from 400 nm to 580 nm, having excellent light-transmission properties in the near-infrared region of from 650 nm to 700 nm, and achieving good pattern formability when used for producing a color filter.

In addition, according to the invention, there can be provided a method for forming a pattern using the colored radiation-sensitive composition, a color filter having a colored film formed by using the colored radiation-sensitive composition and a method for producing the color filter, and a solid-state image sensor having the color filter.

DESCRIPTION OF EMBODIMENTS

Hereinbelow, the present invention is described in greater detail.

Explanations of the constitutional elements described below are based on representative embodiments of the invention, and it is evident that the invention is not limited to them.

Further, the numeric range described in the specification with the term "to" indicates the range which includes the numbers described before and after "to" as a lower limit and an upper limit, respectively.

The colored radiation-sensitive composition for a color filter of the invention includes (A) a pigment, (B) a photopolymerization initiator, and (C) a polymerizable compound, in which the colored radiation-sensitive composition satisfies the following conditions:

when a colored radiation-sensitive composition layer is formed from the colored radiation-sensitive composition such that spectral transmittance at 600 nm becomes 30%, the colored radiation-sensitive composition layer has the following characteristics:

(1) spectral transmittance at 400 nm is 20% or less;
(2) spectral transmittance at 550 nm is 10% or less;
(3) spectral transmittance at 700 nm is 70% or more;
(4) a wavelength resulting in 50% spectral transmittance is in a range of from 650 nm to 680 nm; and
(5) a film thickness of the colored radiation-sensitive composition layer is in a range of from 0.55 μm to 1.8 μm.

When the colored radiation-sensitive composition layer is formed from the colored radiation-sensitive composition of the invention such that spectral transmittance at the 600 nm becomes 30%, the spectral transmittance of the colored radiation-sensitive composition layer at 400 nm is preferably from 0% to 15%, and more preferably from 0% to 10%. The spectral transmittance of the colored radiation-sensitive composition layer at 550 nm is preferably from 0% to 7%, and more preferably from 0% to 5%. The spectral transmittance of the colored radiation-sensitive composition layer at 700 nm is preferably from 75% to 100%, and more preferably from 80% to 100%. Furthermore, a wavelength resulting in 50% spectral transmittance in the colored radiation-sensitive composition layer is preferably in a range of from 652 nm to 675 nm, and more preferably in a range of from 655 nm to 670 nm.

The film thickness of the colored radiation-sensitive composition layer after drying is preferably in a range of from 0.7 μm to 1.6 μm, and more preferably in a range of from 0.8 μm to 1.4 μm.

When the spectral characteristics and the film thickness of the colored radiation-sensitive composition layer are within the above ranges, the effects of the invention are further improved.

It is preferable that the colored radiation-sensitive composition layer has the following spectral characteristics: spectral transmittance at 400 nm is from 0% to 10%, spectral transmittance at 550 nm is from 0% to 8%, spectral transmittance at 700 nm is from 80% to 100%, and a wavelength resulting in 50% spectral transmittance is in a range of from 655 nm to 670 nm; and that a film thickness of the colored radiation-sensitive composition layer after drying is in a range of from 0.8 μm to 1.4 μm.

When the colored radiation-sensitive composition layer has such spectral characteristics and film thickness, the effects of the invention are further improved.

In the colored radiation-sensitive composition of the invention, when a colored radiation-sensitive composition layer is formed on a substrate such that spectral transmittance at 600 nm becomes 30%, a difference (T700−T550) between spectral transmittance at 700 nm (T700) and spectral transmittance at 550 nm (T550) in the colored radiation-sensitive composition layer is generally 75% or more, and preferably 80% or more.

In addition, a difference (T700−T600) between spectral transmittance at 700 nm (T700) and spectral transmittance at 600 nm (T600) in the colored radiation-sensitive composition layer is preferably 50% or more, more preferably 55% or more, and still more preferably 60% or more. When the difference (T700−T600) is within the above ranges, the light-transmission properties in the near-infrared region (650 nm or more) as well as the light-shielding properties in the visible light region (400 nm to 580 nm) are improved, whereby sensitivity of devices having the color filter of the invention is further improved.

Hereinbelow, methods for measuring the spectral characteristics and the film thickness of the colored radiation-sensitive composition layer in the invention are described.

The colored radiation-sensitive composition of the invention was applied on a glass substrate by a method such as spin coating to form the colored radiation-sensitive composition layer, such that the film thickness after drying was in a range of from 0.55 μm to 1.8 μm and spectral transmittance at 600 nm became 30%. The colored radiation-sensitive composition layer was then dried on a hot plate at 100° C. for 180 seconds.

The spectral transmittance of the dried colored radiation-sensitive composition layer formed on the substrate was determined in a wavelength region of from 400 nm to 1000 nm using a spectrophotometer such as ultraviolet-visible-near-infrared spectrophotometer UV 3600 (trade name, manufactured by Shimadzu Corporation) using an uncoated glass substrate as reference.

The film thickness of the colored radiation-sensitive composition layer was determined by measuring the thickness of the dried colored radiation-sensitive composition layer formed on a substrate using stylus surface profiler DEKTAK 150 (trade name, manufactured by ULVAC Inc.).

Hereinbelow, respective components included in the colored radiation-sensitive composition of the invention, which has the above-described spectral characteristics, are explained.

The colored radiation-sensitive composition of the invention includes (A) the pigment, (B) the photopolymerization initiator, and (C) the polymerizable compound as essential components, and may optionally include (D) an ultraviolet absorber, (E) an alkali-soluble resin, and/or other components.

(A) Pigment

The colored radiation-sensitive composition of the invention includes at least one, preferably two or more pigments. The type of the pigment is not particularly restricted, as long as the colored radiation-sensitive composition of the invention satisfies the conditions that, when a colored radiation-sensitive composition layer is formed from the colored radiation-sensitive composition such that spectral transmittance at 600 nm becomes 30%, the colored radiation-sensitive composition layer has the following spectral characteristics: spectral transmittance at 400 nm is 20% or less, the spectral transmittance at 550 nm is 10% or less, the spectral transmittance at 700 nm is 70% or more, and a wavelength resulting in 50% spectral transmittance in a longer wavelength region is in a range of from 630 nm to 690 nm; and the film thickness of the colored radiation-sensitive composition layer is from 0.55 μm to 1.8 μm.

Preferably, (A) the pigment includes (A-1) at least one of an azo yellow pigment or an isoindoline yellow pigment and (A-2) a dioxazine violet pigment.

Examples of the azo yellow pigment include C.I. Pigment Yellows 83, 150, 81, and 155. Among these, C.I. Pigment Yellow 150 is preferable.

Examples of the isoindoline yellow pigment include isoindolinone yellow pigments. Specific examples of the isoindoline yellow pigment include C.I. Pigment Yellows 109, 110, 139, and 185. Among these, C.I. Pigment Yellows 139 and 185 are preferable.

It is preferable that (A-1) the at least one of an azo yellow pigment or an isoindoline yellow pigment is C.I. Pigment Yellow 139.

Examples of the dioxazine violet pigment include C.I. Pigment Violets 23 and 37, and among these, C.I. Pigment Violet 23 is preferable.

The content of (A-1) the at least one of an azo yellow pigment or an isoindoline yellow pigment is preferably from 25% by mass to 50% by mass, and more preferably from 30% by mass to 40% by mass, with respect to a total content of (A-1) the at least one of an azo yellow pigment or an isoindoline yellow pigment and (A-2) the dioxazine violet pigment. When the content of (A-1) the at least one of an azo yellow pigment or an isoindoline yellow pigment is within the above ranges, the colored radiation-sensitive composition layer formed on a substrate using the colored radiation-sensitive composition of the invention such that spectral transmittance at 600 nm becomes 30%, exhibits improved spectral characteristics.

The total content of (A) the pigment is preferably from 5% by mass to 50% by mass, and more preferably from 8% by mass to 45% by mass, with respect to a total solid content of the colored radiation-sensitive composition. When the total content of (A) the pigment is within the above ranges, the colored radiation-sensitive composition layer formed on a substrate using the colored radiation-sensitive composition of the invention such that spectral transmittance at 600 nm becomes 30%, exhibits excellent spectral characteristics in a thin film.

In the colored radiation-sensitive composition of the invention, a pigment and/or dye of another color may be used in combination with (A) the pigment, to the extent that the above-described spectral characteristics do not impaired.

Examples of a red pigment that can be used in combination include C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279.

Examples of an orange pigment that can be used in combination include C. I. Pigment Orange 2, 5, 13, 16, 17:1, 31, 34, 36, 38, 43, 46, 48, 49, 51, 52, 55, 59, 60, 61, 62, 64, 71, and 73.

Examples of a red dye that can be used in combination include C. I. Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274.

Examples of a green pigment that can be used in combination include C. I. Pigment Green 7, 10, 36, 37, and 58.

Examples of a green dye that can be used in combination include C. I. Acid Green 1, 3, 5, 9, 16, 25, 27, and 50.

Examples of a blue pigment that can be used in combination include C. I. Pigment Blue 1, 2, 15, 15:1, 15:2, 15:3, 15:4, 15:6, 16, 22, 60, 64, 66, 79, and 80.

Examples of a blue dye that can be used in combination include C. I. Acid Blue 1, 7, 9, 15, 18, 23, 25, 27, 29, 40, 41, 42, 43, 44, 45, 62, 70, 74, 80, 83, 86, 87, 90, 92, 103, 112, 113, 120, 129, 138, 147, 158, 171, 182, 192, 243, and 324:1.

In the invention, an yellow dye may be used in combination with (A) the pigment. Examples of the yellow dye include C. I. Acid Yellow 1, 3, 7, 9, 11, 17, 23, 25, 29, 34, 36, 42, 54, 72, 73, 76, 79, 98, 99, 111, 112, 114, 116, 184, and 243; and C. I. food yellow 3.

Furthermore, in the invention, a violet dye may be used in combination with (A) the pigment. Examples of the violet dye include C. I. Acid Violet 6B, 7, 9, 17, and 19, and C. I. Acid chrome Violet K3.

The violet dye may be a dipyrromethene pigment represented by the following Formula (M). Examples thereof further include a structure derived from a dipyrromethene metal complex compound obtained from the compound of Formula (M) and a metal or a metallic compound, and a tautomer thereof

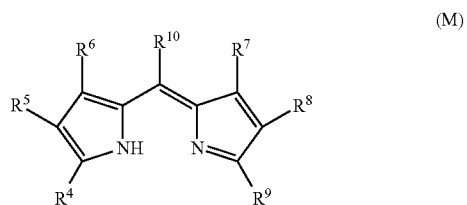

(M)

In Formula (M), $R^4$ to $R^{10}$ each independently represent a hydrogen atom or a monovalent substituent group. Here, $R^4$ and $R^5$ do not linked to each other to form a ring.

Preparation of Pigment Dispersion

It is preferable that the colored radiation-sensitive composition of the invention is prepared by dispersing the pigment in advance, as needed, together with a pigment dispersant, an organic solvent, a pigment derivative, and other components such as a polymer compound to prepare a pigment dispersion, and then mixing the obtained pigment dispersion with (B) the photopolymerization initiator, (C) the polymerizable compound, and optionally other components.

Hereinbelow, the composition of the pigment dispersion and the method for preparing the pigment dispersion are described in detail.

(A) The pigment that can be used in the colored radiation-sensitive composition of the invention is a pigment that has an average particle diameter (r) of from 20 nm to 300 nm, preferably from 25 nm to 250 nm, and more preferably from 30 nm to 200 nm. When the pigment having such average particle diameter is used, pixels having little color irregularity and having high color purity can be obtained. As used herein, the term "average particle diameter" means an average particle diameter of secondary particles formed by aggregation of primary particles (single microcrystal) of the pigment.

The particle diameter distribution of secondary particles of the pigment to be used in the invention (hereinafter, may be simply referred to as "particle diameter distribution") is such that preferably 70% by mass or more, and more preferably 80% by mass or more of the secondary particles with respect to a total mass of the pigment have the particle diameter of from an average particle size −100 nm to an average particle size+100 nm. In the invention, the particle diameter distribution was determined based on a scattering intensity distribution.

A pigment having the above-described average particle diameter and particle diameter distribution can be prepared by forming a mixed solution of pigment(s) in which a commercially available pigment, optionally in combination with other pigment(s) (usually having an average particle diameter of more than 300 nm), is preferably mixed with a dispersant and an organic solvent, and then mixing and dispersing the mixed solution while pulverizing it using a pulverizer such as a bead mill or a roll mill. The pigment thus obtained usually takes the form of a pigment dispersion.

Acquisition of Finer Pigment

In the invention, an organic pigment composed of fine and uniformized particles can be used if necessary. The acquisition of a finer pigment can be achieved through the processes of preparing a high-viscosity liquid composition from at least the pigment, a water-soluble organic solvent and a water-soluble inorganic salt, and grinding the pigment by applying a stress using, for example, a wet-crushing apparatus or the like.

Examples of the water-soluble organic solvent used in the process of obtaining a finer pigment include methanol, ethanol, isopropanol, n-propanol, isobutanol, n-butanol, ethylene glycol, diethylene glycol, diethylene glycol monomethyl ether, diethylene glycol monoethyl ether, diethylene glycol monobutyl ether, propylene glycol, and propylene glycol monomethyl ether acetate.

Other solvents that have low water-solubility or no water-solubility may be used as long as the amount thereof is so small that the solvents are adsorbed to the pigment and do not flow into waste water; examples thereof include benzene, toluene, xylene, ethylbenzene, chlorobenzene, nitrobenzene, aniline, pyridine, quinoline, tetrahydrofuran, dioxane, ethyl acetate, isopropyl acetate, butyl acetate, hexane, heptane, octane, nonane, decane, undecane, dodecane, cyclohexane, methylcyclohexane, a halogenated hydrocarbon, acetone, methyl ethyl ketone, methyl isobutyl ketone, cyclohexanone, dimethylformamide, dimethylsulfoxide and N-methylpyrrolidone.

For the process of obtaining a finer pigment, these solvents may be used singly or may be used as a mixture of two or more kinds thereof if needed.

Examples of the water-soluble inorganic salt used in the process of obtaining a finer pigment include sodium chloride, potassium chloride, calcium chloride, barium chloride and sodium sulfate.

The amount, in terms of mass, of the water-soluble inorganic salt used in the process of obtaining a finer pigment is from 1 time to 50 times that of the pigment. Although a greater amount produces a stronger grinding effect, the amount of the water-soluble inorganic salt in terms of mass is preferably from 1 time to 10 times that of the pigment, from the viewpoint of productivity. The moisture content of the water-soluble inorganic salt used in the process of obtaining a finer pigment is preferably 1% by weight or lower.

The amount of the water-soluble organic solvent used in the process of obtaining a finer pigment is preferably from 50 parts by mass to 300 parts by mass, more preferably from 100 parts by mass to 200 parts by mass, with respect to 100 parts by mass of the pigment.

The operation conditions of the wet-crushing apparatus in the process of obtaining a finer pigment are not particular limited. In order to perform effective grinding with a grinding medium, the operation conditions when the apparatus is a kneader are such that the rotation number of the blade in the apparatus is preferably from 10 rpm to 200 rpm, and the ratio between the rotations of the two axes is preferably relatively high due to greater grinding effects achieved thereby. The total operation time, including dry crushing time, is preferably from 1 hour to 8 hours, and the internal temperature of the apparatus is preferably from 50° C. to 150° C. It is preferable that the water-soluble inorganic salt as a crushing medium has a crushed particle size of from 5 μm to 50 μm, has a sharp particle diameter distribution, and has a spherical shape.

Hereinbelow, the case where (A) the pigment include (A-1) the at least one of an azo yellow pigment or an isoindoline yellow pigment and (A-2) the dioxazine violet pigment, which is a preferable embodiment of the invention, is explained by way of example.

Each of (A-1) the at least one of an azo yellow pigment or an isoindoline yellow pigment and (A-2) the dioxazine violet pigment may be used singly to prepare separate pigment dispersions, or may be used in combination to prepare a single pigment dispersion.

When two or more kinds of the pigment dispersion are used in combination, the composition of the pigment dispersion (excluding the pigment) and/or the method of preparing the pigment dispersion may be the same as or different from one another.

The method for preparing a pigment dispersion is not specifically limited. The method of dispersion may be, for example, a method in which a dispersion obtained by mixing a pigment and a pigment dispersant in advance and dispersing the mixture with a homogenizer or the like is finely-dispersed with a bead disperser using a zirconia beads or the like (for example, trade name: DISPERMAT, manufactured by GETZMANN).

Pigment Dispersant

Examples of a pigment dispersant used for preparing the pigment dispersion include polymer dispersants (such as polyamide amines and salts thereof, polycarboxylic acids and salts thereof, high molecular-weight unsaturated acid esters, modified polyurethanes, modified polyesters, modified poly(meth)acrylates, (meth)acrylic copolymers, or naphthalene sulfonic acid formalin condensates), surfactants such as polyoxyethylene alkyl phosphates, polyoxyethylene alkyl amines, or alkanol amines, and pigment derivatives.

The polymer dispersant may be further classified into a linear polymer, a terminal-modified polymer, a graft polymer, and a block polymer, in accordance with the structure thereof.

Examples of a terminal-modified polymer having an anchor moiety to a pigment surface include polymers having a phosphoric acid group at a terminal, such as those described in JP-A No. 3-112992 and Japanese Patent Application National Publication No. 2003-533455; polymers having a sulfonic acid group at a terminal such as those described in JP-A No. 2002-273191; and polymers having a partial skeleton of an organic dye or a heterocyclic ring such as those described in JP-A No. 9-77994. Furthermore, polymers having a terminal into which two or more anchor moieties to a pigment surface (such as an acidic group, a basic group, a partial skeleton of an organic dye or a heterocyclic ring) are introduced, such as those described in JP-A No. 2007-277514, are preferable since they exhibit favorable dispersion stability.

Examples of a graft polymer having an anchor moiety to a pigment surface include reaction products of poly(lower alkylene imine) and polyester, such as those described in JP-A No. 54-37082, Japanese Patent Application National Publication No. 8-507960, and JP-A No. 2009-258668; reaction products of polyallylamine and polyester, such as those described in JP-A No. 9-169821; copolymers of a macromonomer and a nitrogen-containing monomer, such as those described in JP-A No. 10-339949 and JP-A No. 2004-37986; graft polymers having a partial skeleton of an organic dye or a heterocyclic ring, such as those described in JP-A No. 2003-238837, JP-A No. 2008-9426, and JP-A No. 2008-81732; and copolymers of a macromonomer and an acidic group-containing monomer, such as those described in JP-A No. 2010-106268. Amphoteric dispersant resins having a basic group and an acidic group, such as those described in JP-A No. 2009-203462, are more preferable from the viewpoints of dispersibility and dispersion stability of a pigment dispersion, and developability of a colored radiation-sensitive composition.

The macromonomer used for producing the graft polymer having an anchor moiety to a pigment surface by radical polymerization may be selected from known macromonomers, such as AA-6 (methyl polymethacrylate having a terminal methacryloyl group), AS-6 (polystyrene having a terminal methacryloyl group), AN-6S (styrene-acrylonitrile copolymer having a terminal methacryloyl group) and AB-6 (polybutyl acrylate having a terminal methacryloyl group) (trade names, manufactured by Toagosei Co., Ltd.); PLACCEL FM5 (a product in which 5 molar equivalent of ε-caprolactone is added to 2-hydroxyethyl methacrylate), and FA10L (a product in which 10 molar equivalent of ε-caprolactone is added to 2-hydroxyethyl acrylate) (trade names, manufactured by Daicel Chemical Industries, Ltd.); and a polyester macromonomer described in JP-A No. 2-272009. Among these, polyester macromonomers having excellent flexibility and solvent compatibility are more preferable in view of dispersibility and dispersion stability of a pigment dispersion, and developability of a colored radiation-sensitive composition obtained by using the pigment dispersion. Furthermore, polyester macromonomers described in JP-A No. 2-272009 are still more preferable.

Preferable examples of the block polymer having an anchor moiety to a pigment surface include those described in JP-A No. 2003-49110 and JP-A No. 2009-52010.

The pigment dispersants that may be used in the invention are also available as commercial products, and specific examples thereof include DISPERBYK-101 (polyamide amine phosphate), 107 (carboxylic acid ester), 110 (acid group-containing copolymer), 130 (polyamide), 161, 162, 163, 164, 165, 166, and 170 (high-molecular-weight copolymer), and BYK-P104, and P105 (high-molecular-weight unsaturated polycarboxylic acid) (trade names, manufactured by BYK Chemie); EFKA 4047, 4050, 4010, 4165 (polyurethane-based), EFKA 4330 to 4340 (block copolymer), 4400 to 4402 (modified polyacrylate), 5010 (polyester amide), 5765 (high-molecular-weight polycarboxylate), 6220 (fatty acid polyester), 6745 (phthalocyanine derivative), and 6750 (azo pigment derivative) (trade names, manufactured by EFKA); AJISPER PB821, PB822, PB880 and PB881 (trade names, manufactured by Ajinomoto Fine-Techno Co., Inc.); FLOWLEN TG-710 (urethane oligomer), POLYFLOW No. 50E and No. 300 (acrylic copolymer) (trade names, manufactured by Kyoeisha Chemical Co., Ltd.); DISPARLON KS-860, 873SN, 874, #2150 (aliphatic polycarboxylic acid), #7004 (polyether ester), DA-703-50, DA-705, and DA-725 (trade names, manufactured by Kusumoto Chemicals, Ltd.); DEMOL RN, N (naphthalene sulfonic acid formalin polycondensate), MS, C, SN-B (aromatic sulfonic acid formalin polycondensate), HOMOGENOL L-18 (high-molecular polycarboxylic acid), EMULGEN 920, 930, 935, and 985 (polyoxyethylene nonyl phenyl ether), and ACETAMIN 86 (stearyl amine acetate) (trade names, manufactured by Kao Corporation); SOLSPERSE 5000 (phthalocyanine derivative), 22000 (azo pigment derivative), 13240 (polyester amine), 3000, 17000, and 27000 (polymer having a functional moiety at a terminal), 24000, 28000, 32000, and 38500 (graft polymer) (trade names, manufactured by the Lubrizol Corporation); NIKKOL T106 (polyoxyethylene sorbitan monooleate), and MYS-IEX (polyoxyethylene monostearate) (trade names, manufactured by Nikko Chemicals, Co., Ltd.); HINOACT T-8000E and the like (trade name, manufactured by Kawaken Fine Chemicals, Co., Ltd.); KP341 (organosiloxane polymer) (trade name, manufactured by Shin-Etsu Chemical Co., Ltd.); W001 (cationic surfactant, trade name, available from Yusho Co., Ltd.); nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid ester; W004, W005, and W017 (anionic surfactants) (trade names, available from Yusho Co., Ltd.); EFKA-46, EFKA-47, EFKA-47EA, EFKA POLYMER 100, EFKA POLYMER 400, EFKA POLYMER 401, EFKA and POLYMER 450 (trade names, manufactured by Morishita and Co., Ltd.); DISPERSE AID 6, DISPERSE AID 8, DISPERSE AID 15, DISPERSE AID 9100 and the like (polymer dispersants) (trade names, manufactured by San Nopco Limited); ADEKA PLURONIC L31, F38, L42, L44, L61, L64, F68, L72, P95, F77, P84, F87, P94, L101, P103, F108, L121, and P-123 (trade names, manufactured by Adeka Corporation); and IONET S-20 (trade name, manufactured by Sanyo Chemical Industries, Ltd.).

These pigment dispersants may be used singly or in combination of two or more kinds thereof. In the invention, a combination of a pigment derivative and a polymer dispersant is preferably used. The pigment dispersant may be a combination of a terminal-modified polymer, graft polymer, or block copolymer having an anchor moiety to a pigment surface with, as a pigment dispersant, an alkali-soluble binder described below. Furthermore, as the pigment dispersant, an alkali-soluble binder described below or a compound represented by the following Formula (ED) may be used.

The content of the pigment dispersant in the pigment dispersion is preferably from 1 part by mass to 80 parts by mass, more preferably from 5 parts by mass to 70 parts by mass, still more preferably from 10 parts by mass to 60 parts by mass, with respect to 100 parts by mass of the pigment.

Specifically, when the polymer dispersant is used, the amount thereof is preferably from 5 parts by mass to 100 parts by mass, more preferably from 10 parts by mass to 80 parts by mass, with respect to 100 parts by mass of the pigment.

Pigment Derivative

It is preferable that the pigment dispersion further contains a pigment derivative.

Here, the pigment derivative means a compound having a structure in which an organic pigment is partially substituted with an acidic group, a basic group, or phthalimide methyl group. From the viewpoints of dispersibility and dispersion stability, the pigment derivative preferably contains an acidic group or a basic group.

Examples of the organic pigment constituting the pigment derivative include a diketopyrrolopyrrole pigment, an azo pigment, a phthalocyanine pigment, an anthraquinone pigment, a quinacridone pigment, a dioxazine pigment, a perinone pigment, a perylene pigment, a thioindigo pigment, an isoindoline pigment, an isoindolinone pigment, a quinophthalone pigment, a threne pigment, and metal complex pigment.

Preferable examples of the acidic group contained in the pigment derivative include a sulfonic acid group, a carboxylic acid group, and a sulfonic acid quaternary ammonium salt group and a carboxylic acid quaternary ammonium salt group. Among these, a carboxylic acid group and a sulfonic acid group are preferable, and a sulfonic acid group is more preferable. The basic group contained in the pigment derivative is preferably an amino group, and more preferably a tertiary amino group.

The pigment derivative is preferably a quinoline pigment derivative, a benzimidazolone pigment derivative, or an isoindoline pigment derivative, and more preferably a quinoline pigment derivative or a benzimidazolone pigment derivative.

The content of the pigment derivative in the pigment dispersion is preferably from 1% by mass to 50% by mass, and more preferably from 3% by mass to 30% by mass, with respect to a total mass of the pigment. These pigment derivatives may be used singly or in combination of two or more kinds thereof.

Further, when two or more kinds of the pigment derivative are used in combination, the use amount (total amount) of the pigment derivatives is preferably in a range of from 1 part by mass to 30 parts by mass, more preferably from 3 parts by mass to 20 parts by mass parts by mass, and still more preferably from 5 parts by mass to 15 parts by mass, with respect to 100 parts by mass of the pigment.

Organic Solvent

The pigment dispersion may further contain an organic solvent.

The organic solvent is selected based on the solubility of each component contained in the pigment dispersion, the coating properties when the pigment dispersion is used for the colored radiation-sensitive composition, or the like. Examples of the organic solvent include esters, ethers, ketones, and aromatic hydrocarbons. Preferable examples thereof include 3-ethoxymethyl propionate, 3-ethoxyethyl propionate, ethyl cellosolve acetate, ethyl lactate, diethylene glycol dimethyl ether, butyl acetate, 3-methoxy methyl propionate, 2-heptanone, cyclohexanone, diethylene glycol monoethyl ether acetate, diethylene glycol monobutyl ether acetate, propylene glycol monomethyl ether, and propylene glycol monomethyl ether acetate. It is preferable to use (F) an organic solvent described below, which may be included in the colored radiation-sensitive composition.

The content of the organic solvent in the pigment dispersion is preferably from 50% by mass to 95% by mass, and more preferably from 70% by mass to 90% by mass.

Polymer Compound

The pigment dispersion may further contain a polymer compound in addition to the above described components, in order to improve dispersion stability and controlling developability when the pigment dispersion is used for the colored radiation-sensitive composition.

Examples of the polymer compound include a polyamide amine and salts thereof, a polycarboxylic acid and salts thereof, a high molecular-weight unsaturated acid ester, a modified polyurethane, a modified polyester, a modified poly(meth)acrylate, a (meth)acrylic copolymer (preferably, a (meth)acrylate copolymer containing a carboxylic acid group and, in a side chain thereof, a polymerizable group), and a naphthalene sulfonic acid formalin condensate. The material for these polymers are preferably a terminal-modified polymer, graft polymer or block polymer having an anchor moiety for a pigment surface, since it can attach to the pigment surface and act to prevent re-aggregation of the pigment. Example of the polymer material include a graft copolymer containing, as copolymerization units, a monomer having a heterocyclic ring and a polymerizable oligomer having an ethylenically unsaturated bond.

Examples of the polymer material further include a polyamide amine phosphate salt, a high molecular-weight unsaturated polycarboxylic acid, a polyether ester, an aromatic sulfonic acid formalin condensate, polyoxyethylene nonylphenyl ether, polyester amine, polyoxyethylene sorbitan monooleate, and polyoxyethylene monostearate.

These polymer materials may be used singly or in combination of two or more kinds thereof.

The content of the polymer material in the pigment dispersion is preferably from 20% by mass to 80% by mass, more preferably from 30% by mass to 70% by mass, and still more preferably from 40% by mass to 60% by mass, with respect to a total mass of the pigment.

Preparation of Colored Radiation-Sensitive Composition

The colored radiation-sensitive composition can be prepared using (A) the pigment (or the pigment dispersion) described above, together with (B) the photopolymerization initiator, (C) the polymerizable compound and optionally respective components such as (D) an ultraviolet absorber, (E) an alkali-soluble resin, (F) an organic solvent, or a surfactant. The colored radiation-sensitive composition is used for forming colored pixels of a color filter of the invention, and for example, a colored cured film that is obtained by curing the colored radiation-sensitive composition by polymerization is used as a colored pixel.

Hereinbelow, each component contained in the colored radiation-sensitive composition of the invention is described in detail.

Here, regarding the colored radiation-sensitive composition of the invention, a "total solid content" indicates a total mass of the components of the colored radiation-sensitive composition excluding an organic solvent.

As used herein, the term "alkyl group" indicates a "linear, branched, or cyclic" alkyl group, which may be either substituted or unsubstituted.

As used herein, the term "(meth)acrylate" indicates both or any one of acrylate and methacrylate, the term "(meth)acryl" indicates both or any one of acryl and methacryl, and the term "(meth)acryloyl" indicates both or any one of acryloyl and methacryloyl.

The monomer as used herein is distinguished from oligomers and polymers, and indicates a compound having weight average molecular weight of 2,000 or less. As used herein, the term "polymerizable compound" indicates a compound having a polymerizable functional group, and it may be either a monomer or a polymer. The term "polymerizable functional group" indicates a group involved with a polymerization reaction.

Further, as used herein, the description regarding a group (or an atomic group) that is not associated with the description of "substituted or unsubstituted" includes not only a group having no substituent group but also a group having a substituent group. For example, the term "alkyl group" includes not only an alkyl group having no substituent group (that is, an unsubstituted alkyl group) but also an alkyl group having a substituent group (that is, a substituted alkyl group).

As used herein, the term "process" includes not only a separate process but also a process that is not clearly distinguished from other process as long as the desired effect of the process is obtained therefrom.

As used herein, the term "radiation" includes visible light, ultraviolet light, far ultraviolet light, electronic beam, X-ray, and the like.

Photopolymerization Initiator

The radiation-sensitive composition of the invention contains (B) the photopolymerization initiator.

As the photopolymerization initiator (hereinafter, may be simply referred to as a "polymerization initiator") used in the invention, those known as photopolymerization initiators, which are described below, may be used.

The photopolymerization initiator used in the invention is not particularly limited as far as it has an ability of initiating the polymerization of the polymerizable compound, and may be selected as appropriate from known photopolymerization initiators. For example, compounds having sensitivity to light in the ultraviolet/visible region are preferable.

The photopolymerization initiator may be an activating agent that can interact in some way with a photo-excited sensitizer to give an active radical, or may be an initiator that can initiate cationic polymerization depending on the kind of a monomer.

Further, it is preferable that the photopolymerization initiator contains at least one compound which has a molecular absorption coefficient of approximately 50 in the wavelength region of from about 300 nm to about 800 nm (more preferably from 330 nm to 500 nm).

Examples of the photopolymerization initiator in the invention include halogenated hydrocarbon derivatives (for example, those having a triazine skeleton, and those having an oxadiazole skeleton); acyl phosphine compounds such as acyl phosphine oxide; hexaarylbiimidazole; oxime compounds such as oxime derivatives; organic peroxides; thio compounds; ketone compounds; aromatic onium salts; keto oxime ethers; aminoacetophenone compounds; and hydroxyacetophenone. Among these, oxime compounds are preferable.

Examples of the halogenated hydrocarbon compounds having a triazine skeleton include compounds described in Wakabayashi et. al., Bull. Chem. Soc. Japan, 42, 2924 (1969), compounds such as those described in British Patent No. 1388492, compounds such as those described in JP-A No. 53-133428, compounds such as those described in German Patent No. 3337024, compounds such as those described in F. C. Schaefer et. al., J. Org. Chem., 29, 1527 (1964), compounds such as those described in JP-A No. 62-58241, compounds such as those described in JP-A No. 5-281728, compounds such as those described in JP-A No. 5-34920, and compounds such as those described in U.S. Pat. No. 4,212,976.

Examples of the compound described in U.S. Pat. No. 4,212,976 include a compound having an oxadiazole skeleton (such as 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole; 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-butoxystyryl)-1,3,4-oxadiazole, or 2-tribromomethyl-5-styryl-1,3,4-oxadiazole).

Examples of the photopolymerization initiator further include acridine derivatives (for example, 9-phenylacridine and 1,7-bis(9,9'-acridinyl)heptane), N-phenylglycine, polyhalogen compounds (for example, carbon tetrabromide, phenyl tribromomethyl sulfone, and phenyl trichloromethyl ketone), coumarines (for example, 3-(2-benzofuranoyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazol-2-yl coumarin, and coumarin compounds such as those described in JP-A Nos. 5-19475, 7-271028, 2002-363206, 2002-363207, 2002-363208, and 2002-363209), acylphosphine oxides (for example, bis(2,4,6-trimethylbenzoyl)-phenylphosphine oxide, bis(2,6-dimethoxybenzoyl)-2,4,4-trimethyl-pentylphenylphosphine oxide, and LUCIRIN TPO (trade name, manufactured by BASF Corporation)), metallocenes (for example, bis(η5-2,4-cyclopentadien-1-yl)-bis(2,6-difluoro-3-(1H-pyrrol-1-yl)-phenyl)titanium, and η5-cyclopentadienyl-η6-cumenyl-iron (1+)-hexafluorophosphate(1-)), and compounds such as those described in JP-A No. 53-133428, JP-B Nos. 57-1819 and 57-6096, and U.S. Pat. No. 3,615,455.

Examples of the ketone compound include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonyl benzophenone, a benzophenone tetracarboxylic acid and a tetramethyl ester thereof, 4,4'-bis(dialkylamino)benzophenones (for example, 4,4'-bis(dimethylamino)benzophenone, 4,4'-bisdicyclohexylamino)benzophenone, 4,4'-bis(diethyl amino)benzophenone, 4,4'-bis(dihydroxyethylamino)benzophenone, 4-methoxy-4'-(dimethylamino)benzophenone, and 4,4'-dimethoxybenzophenone), 4-(dimethylamino)benzophenone, 4-(dimethylamino)acetophenone), benzyl, anthraquinone, 2-t-butylanthraquinone, 2-methylanthraquinone, phenanthraquinone, xanthone, thioxanthone, 2-chloro-thioxanthone, 2,4-diethylthioxanthone, fluorenone, 2-benzyl-dimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]propanol oligomer, benzoin, benzoin ethers (for example, benzoin methyl ether, benzoin ethyl ether, benzoin propyl ether, benzoin isopropyl ether, benzoin phenyl ether, and benzyl dimethyl ketal), acridone, chloroacridone, N-methylacridone, N-butyl acridone, and N-butyl-chloro acridone.

As the photopolymerization initiator, a hydroxyacetophenone compound, an aminoacetophenone compound, or an acyl phosphine compound may also be preferably used. More specifically, for example, an aminoacetophenone initiator described in JP-A No. 10-291969, and an acyl phosphine oxide initiator such as those described in Japanese Patent No. 4225898 are also applicable.

As the hydroxyacetophenone initiator, IRGACURE-184, DAROCUR-1173, IRGACURE-500, IRGACURE-2959, and IRGACURE-127 (trade names, manufactured by BASF Corporation) may be used. Examples of commercially available products of the aminoacetophenone initiator include IRGACURE-907, IRGACURE-369, and IRGACURE-379 (trade names, manufactured by BASF Corporation). As the aminoacetophenone initiator, compounds whose absorption wavelength is matched to a long wavelength light source of 365 nm, 405 nm, or the like, such as those described in JP-A No. 2009-191179, may be used. Commercially available products of the acyl phosphine initiator such as IRGACURE-819 or DAROCUR-TPO (trade names, manufactured by BASF Corporation) may also be used.

The photopolymerization initiator is more preferably an oxime compound. Specific examples of the oxime initiator, which can be used, include compounds described in JP-A No. 2001-233842, compounds described in JP-A No. 2000-80068, and compounds described in JP-A No. 2006-342166.

Examples of the oxime compound including an oxime derivative, which is preferably used as the photopolymerization initiator in the invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of the oxime compound further include compounds such as those described in J. C. S. Perkin II (1979) pages 1653 to 1660, J. C. S. Perkin II (1979) pages 156 to 162, Journal of Photopolymer Science and Technology (1995) pages 202 to 232, and JP-A No. 2000-66385, and compounds such as those described in JP-A No. 2000-80068, Japanese National Phase Publication No. 2004-534797, and JP-A No. 2006-342166.

Examples of commercially available products thereof include IRGACURE OXE-01 (manufactured by BASF Corporation) and IRGACURE OXE-02 (manufactured by BASF Corporation).

Further, as the oxime ester compounds other than those described above, compounds in which oxime is linked to the N-position of carbazole, as described in Japanese National Phase Publication No. 2009-519904; compounds in which a hetero substituent is introduced into a benzophenone moiety, as described in U.S. Pat. No. 7,626,957; compounds in which a nitro group is introduced into a dye moiety, as described in JP-A No. 2010-15025 and U.S. Patent Publication No. 2009-292039; ketooxime compounds described in WO 2009/131189; compounds containing a triazine skeleton and an oxime skeleton in the same molecule, as described in U.S. Pat. No. 7,556,910; compounds which has an absorption maximum at 405 nm and has good sensitivity to a g-line light source, as described in JP-A No. 2009-221114; or the like may be used.

Further, cyclic oxime compounds described in JP-A Nos. 2007-231000 and 2007-322744 may also be used preferably. Among these cyclic oxime compounds, cyclic oxime compounds condensed to a carbazole dye, as described in JP-A Nos. 2010-32985 and 2010-185072, are particularly preferable from the viewpoint of its high light absorptivity and in order to attain a high sensitivity.

Furthermore, compounds having an unsaturated bond at a specific moiety of an oxime compound, as described in JP-A No. 2009-242469, may be used preferably because a high sensitivity is attained by regenerating an active radical from a polymerization inactive radical.

Most preferably, oxime compounds having a specific substituent as described in JP-A No. 2007-269779, or oxime compounds having a thioaryl group as described in JP-A No. 2009-191061 may be used.

Specifically, as the oxime compound, a compound represented by the following Formula (OX-1) is preferable. Here, the oxime compound according to the invention may be an oxime compound in which the N—O bond of the oxime is in the (E) form or an oxime compound in which the N—O bond of the oxime is in the (Z) form, or an oxime compound in which the N—O bond of the oxime is a mixture of the (E) form and the (Z) form.

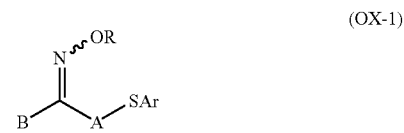

(OX-1)

In Formula (OX-1), R and B each independently represent a monovalent substituent; A represents a divalent organic group; and Ar represents an aryl group.

In Formula (OX-1), the monovalent substituent represented by R is preferably a monovalent nonmetallic atomic group.

Examples of the monovalent nonmetallic atomic group include an alkyl group, an aryl group, an acyl group, an alkoxycarbonyl group, an aryloxycarbonyl group, a heterocyclic group, an alkylthiocarbonyl group, and an arylthiocarbonyl group. These groups may have one or more substituents. Further, the substituents described above may be further substituted by another substituent.

Examples of the substituent include a halogen atom, an aryloxy group, an alkoxycarbonyl group, an aryloxycarbonyl group, an acyloxy group, an acyl group, an alkyl group, and an aryl group.

The alkyl group which may have a substituent is preferably an alkyl group having 1 to 30 carbon atoms, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group which may have a substituent is preferably an aryl group having 6 to 30 carbon atoms, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, an m-tolyl group, a p-tolyl group, a xylyl group, an o-cumenyl group, an m-cumenyl group, a p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group which may have a substituent is preferably an acyl group having 2 to 20 carbon atoms, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group which may have a substituent is preferably an alkoxycarbonyl group having 2 to 20 carbon atoms, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group, which may have a substituent, include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The heterocyclic group which may have a substituent is preferably an aromatic or aliphatic heterocyclic group that contains a nitrogen atom, an oxygen atom, a sulfur atom, or a phosphorous atom.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isooxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthryl group.

Specific examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group which may have a substituent include a 1-naphthylthiocarbonyl group, a 2-naphthylthiocarbonyl group, a 4-methylsufanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, 3-nitrophenylthiocarbonyl group, a 4-fluorophenylthiocarbonyl group, 4-cyanophenylthiocarbonyl group, and a 4-methoxyphenylthiocarbonyl group.

In Formula (OX-1), the monovalent substituent represented by B represents an aryl group, a heterocyclic group, an arylcarbonyl group, or a heterocyclic carbonyl group. These groups may further have one or more substituents. Examples of the substituents include the substituents described above. Further, the substituents may further be substituted by another substituent.

Among these, the structures shown below are particularly preferable.

In the structures described below, Y, X, and n have the same definitions and the same preferable definitions as Y, X, and n in Formula (OX-2) described below, respectively.

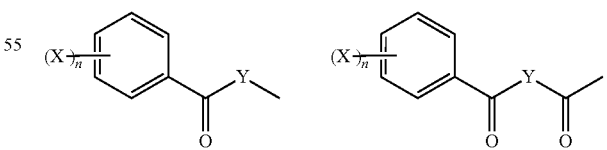

Formula (OX-1), examples of the divalent organic group represented by A include an alkylene group having 1 to 12 carbon atoms, a cycloalkylene group, and an alkynylene group. These groups may have one or more substituents. Examples of the substituents may include the substituents described above. Further, the substituents may further be substituted by another substituent.

Among these, from the viewpoints of enhancing the sensitivity, and suppressing coloring due to heat-aging, A in Formula (OX-1) is preferably an unsubstituted alkylene group, an alkylene group substituted by an alkyl group (such as a methyl group, an ethyl group, a tert-butyl group, or a dodecyl group), an alkylene group substituted by an alkenyl group (such as a vinyl group or an allyl group), or an alkylene group substituted by an aryl group (such as a phenyl group, a p-tolyl group, a xylyl group, a cumenyl group, a naphthyl group, an anthryl group, a phenanthryl group, or a styryl group).

In Formula (OX-1), the aryl group represented by Ar is preferably an aryl group having 6 to 30 carbon atoms, which may have a substituent. Examples of the substituent include the same substituents as the substituents introduced into the substituted aryl groups, which are exemplified above as the specific examples of the aryl group which may have a substituent.

Among these, from the viewpoints of enhancing the sensitivity and suppressing coloring due to heat-aging, a substituted or unsubstituted phenyl group is preferable.

In Formula (OX-1), the structure of "SAr", which is formed by Ar and the adjacent S in Formula (OX-1), is preferably the structure shown below, from the viewpoint of sensitivity. Here, Me represents a methyl group, and Et represents an ethyl group.

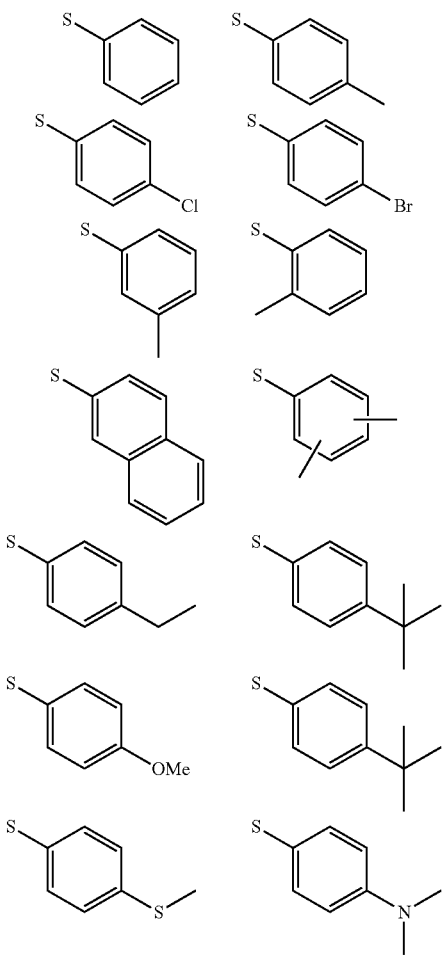

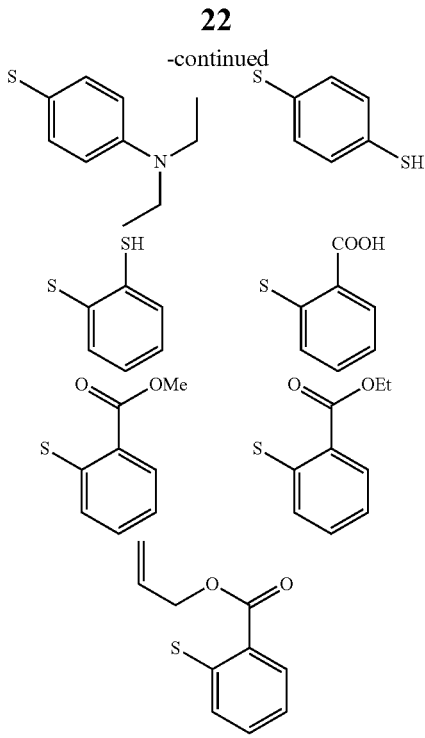

The oxime compound is preferably a compound represented by the following Formula (OX-2).

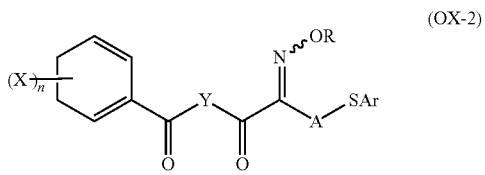

(OX-2)

In Formula (OX-2), R and X each independently represent a monovalent substituent; A and Y each independently represent a divalent organic group; Ar represents an aryl group; and n represents an integer of from 0 to 5. When n is an integer of from 2 to 5, plural Xs may be the same as or different from one another.

R, A, and Ar in Formula (OX-2) have the same definitions and the same preferable definitions as R, A, and Ar in Formula (OX-1), respectively.

In Formula (OX-2), examples of the monovalent substituent represented by X include an alkyl group, an aryl group, an alkoxy group, an aryloxy group, an acyloxy group, an acyl group, an alkoxycarbonyl group, an amino group, a heterocyclic group, and a halogen atom. These groups may have one or more substituents. Examples of the substituents may include the substituents described above. Further, the substituents may further be substituted by another substituent.

Among these, X in Formula (OX-2) is preferably an alkyl group, from the viewpoints of the solvent solubility and improvement in absorption efficiency in a long wavelength region.

Further, n in Formula (OX-2) represents an integer of from 0 to 5, and preferably represents an integer of from 0 to 2.

Examples of the divalent organic group represented by Y in Formula (OX-2) include the structures shown below. Here, in the groups shown below, the "*" sign indicates a bonding site at which Y bonds to the adjacent carbon atom in Formula (OX-2).

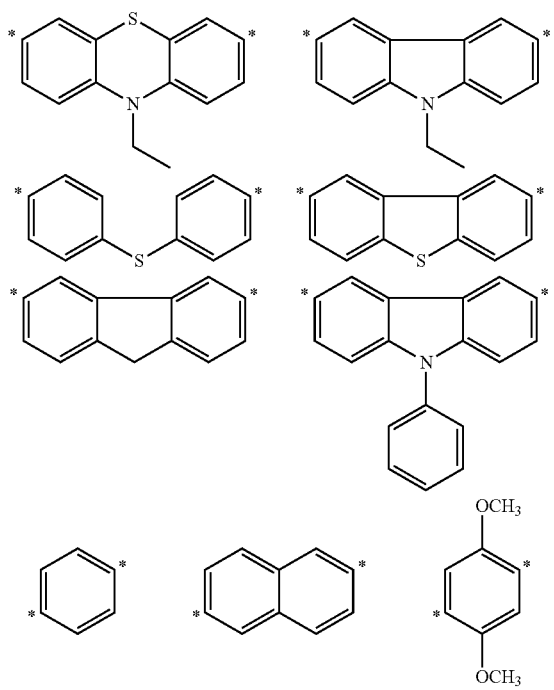

Among these photopolymerization initiators, from the viewpoint of enhancement in sensitivity, the following structures are preferable.

Moreover, the oxime compound is preferably a compound represented by the following Formula (OX-3).

(OX-3)

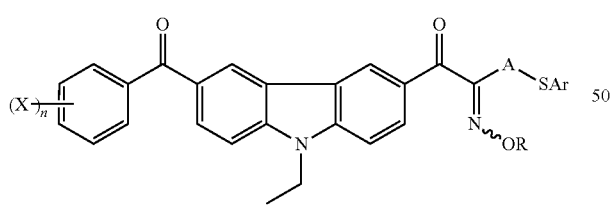

In Formula (OX-3), R and X each independently represent a monovalent substituent; A represents a divalent organic group; Ar represents an aryl group; and n represents an integer of from 0 to 5. When n is an integer of from 2 to 5, plural Xs may be the same as or different from one another.

R, X, A, Ar, and n in Formula (OX-3) have the same definitions and the same preferable definitions as R, X, A, Ar, and n in Formula (OX-2), respectively.

Specific examples of the oxime compound which is preferably used are shown below, but the invention is not limited to these specific examples.

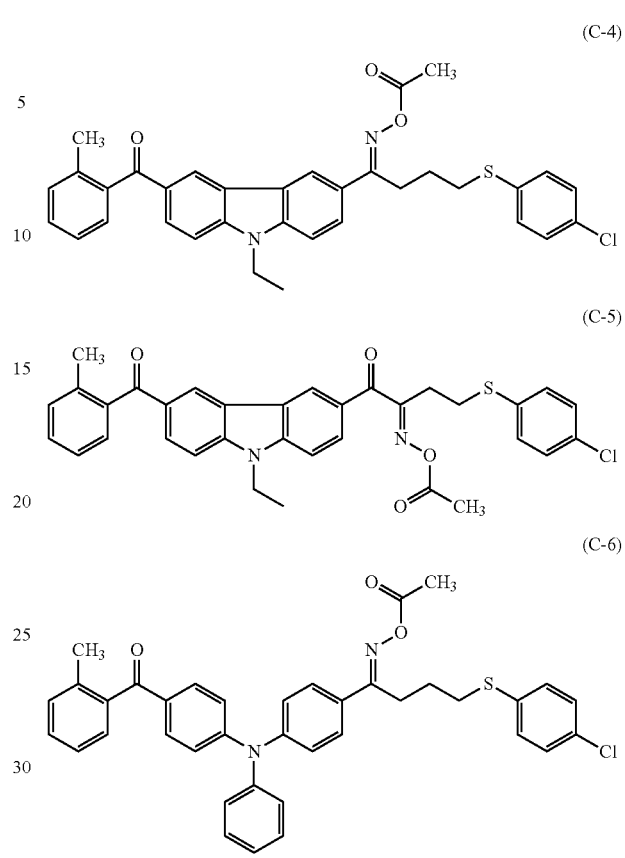

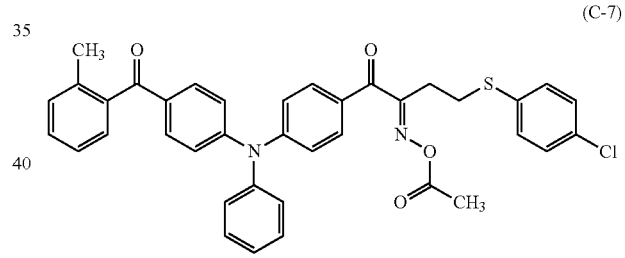

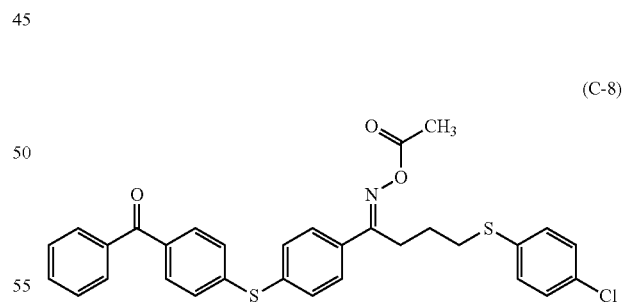

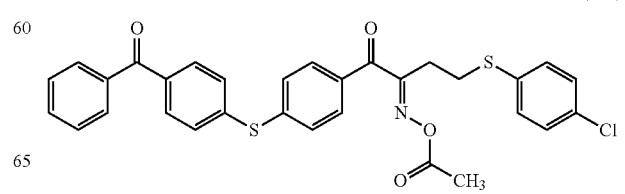

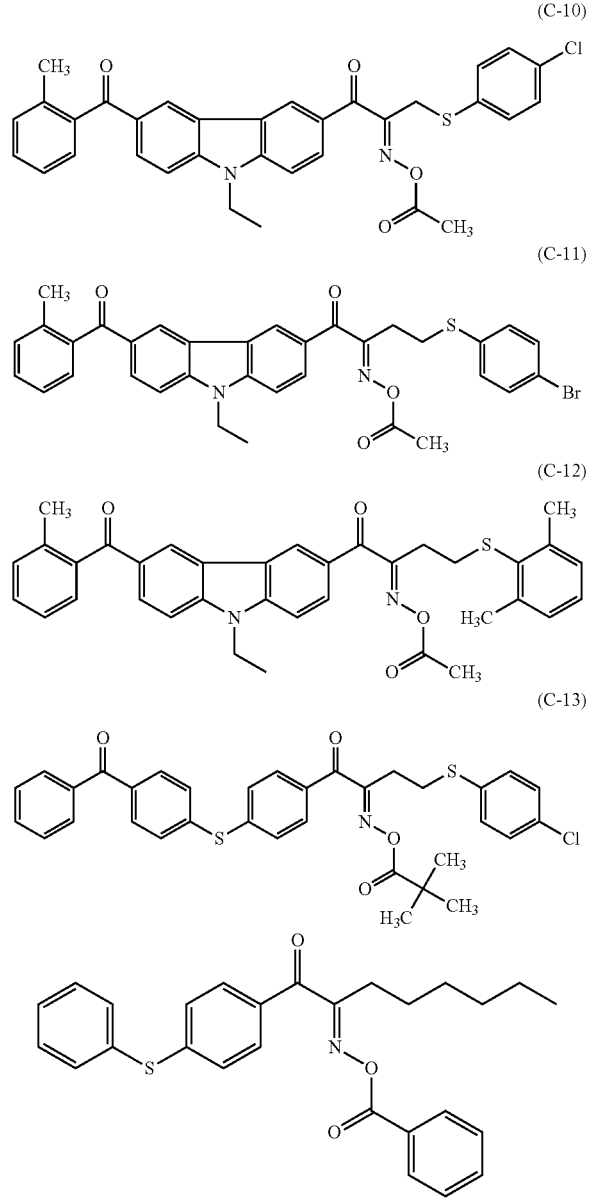

The oxime compound has a maximum absorption wavelength in a wavelength region of from 350 nm to 500 nm, preferably has an absorption wavelength in a wavelength region of from 360 nm to 480 nm, and still more preferably has a high absorbance at 365 nm and 455 nm.

The molar absorption coefficient of the oxime compound at 365 nm or 405 nm is preferably from 1,000 to 300,000, more preferably from 2,000 to 300,000, and particularly preferably from 5,000 to 200,000, from the viewpoint of the sensitivity.

The molar absorption coefficient of a compound may be determined by a known method, specifically, for example, through measurement using an ultraviolet/visible light spectrophotometer (trade name: CARRY-5 SPECTROPHOTOMETER, manufactured by Varian) at a concentration of 0.01 g/L using an ethyl acetate as a solvent.

In the invention, two or more photopolymerization initiators may be used in a combination as required.

The content of the photopolymerization initiator included in the colored radiation-sensitive composition of the invention (total content in the case of plural kinds of photopolymerization initiators being included) is preferably from 0.1% by mass to 20% by mass, more preferably from 0.5% by mass to 10% by mass, and still more preferably from 1% by mass to 5% by mass, with respect to a total solid content of the colored radiation-sensitive composition. When the content is within the above ranges, good sensitivity and pattern formability can be obtained.

The colored radiation-sensitive composition may contain a sensitizer for the purpose of improving radical generation efficiency of the photopolymerization initiator, and shifting the sensitive wavelength to a longer wavelength. The sensitizer that can be used in the invention is preferably a sensitizer capable of sensitizing (C) the photopolymerization initiator by an electron transfer mechanism or an energy transfer mechanism.

Examples of the sensitizer that can be used in the colored radiation-sensitive composition include compounds such as those described in paragraphs [0101] to [0154] of JP-A No. 2008-32803.

From a viewpoint of light absorption efficiency to the deep portion and the decomposition efficiency of an initiator, the content of the sensitizer in the colored radiation-sensitive composition is preferably from 0.1% by mass to 20% by mass, and more preferably from 0.5% by mass to 15% by mass, with respect to a total solid content of the colored radiation-sensitive composition.

These sensitizers may be used singly or in combination of two or more kinds thereof.

(C) Polymerizable Compound

The colored radiation-sensitive composition includes (C) the polymerizable compound.

More specifically, the polymerizable compound is selected from compounds containing at least one, preferably two or more, terminal ethylenically unsaturated bonds. Among these, a tetra or higher-functional polyfunctional polymerizable compound is preferable, and a penta- or higher-functional compound is more preferable.

Such compounds are widely known in the art, and, in the invention, any of these compounds may be used without any restriction. The compounds may have a chemical form selected from a monomer, a prepolymer (i.e. a dimer, a trimer or an oligomer) or a mixture thereof, or a (co)polymer thereof. In the invention, these polymerizable compounds may be used singly or in combination of two or more kinds thereof.

Examples of the monomer and prepolymer thereof include an unsaturated carboxylic acid (such as acrylic acid, methacrylic acid, itaconic acid, crotonic acid, isocrotonic acid, or maleic acid) and esters and amides thereof, and (co)polymers thereof. Preferable examples thereof include esters of an unsaturated carboxylic acid and an aliphatic polyhydric alcohol compound, amides of an unsaturated carboxylic acid and an aliphatic polyvalent amine compound, and (co)polymers thereof. Further, an addition-reaction product of unsaturated carboxylic acid esters or amides, which have a nucleophilic substituent such as a hydroxy group, an amino group, or a mercapto group, with mono-functional or poly-functional isocyanates or epoxies; and a dehydration condensation product of unsaturated carboxylic acid esters or amides with a mono-functional or poly-functional carboxylic acid, are suitably used. Moreover, an addition product of unsaturated carboxylic acid esters or amides, which have an electrophilic substituent such as an isocyanate group or an epoxy group, with mono-functional or poly-functional alcohols, amines or thiols; and a substitution-reaction product of unsaturated carboxylic acid esters or amides, which have a releasable substituent such as a halogen group or a tosyloxy group, with mono-functional or poly-functional alcohols, amines or thiols, are suitably used. Furthermore, as another example, a group of compounds obtained by replacing the above described unsaturated carboxylic acid with an unsaturated phosphonic acid, styrene, vinyl ether or the like can also be used.

Specific examples thereof that can be used in the invention include compounds such as those described in paragraphs [0095] to [0108] of JP-A No. 2009-288705.

The polymerizable monomer is preferably a compound which has at least one addition-polymerizable ethylenically unsaturated group and has a boiling point of 100° C. or higher at atmospheric pressure. Examples of the compound include a monofunctional acrylate or methacrylate such as polyethylene glycol mono(meth)acrylate, polypropylene glycol mono(meth)acrylate or phenoxyethyl (meth)acrylate; polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl) isocyanurate; a compound formed by adding ethyleneoxide or propyleneoxide to a polyfunctional alcohol such as glycerin or trimethylolethane and (meth)acrylating the resultant adduct; urethane acrylates such as those described in JP-B Nos. 48-41708 and 50-6034 and JP-A No. 51-37193; polyester acrylates such as those described in JP-A No. 48-64183 and JP-B Nos. 49-43191 and 52-30490; and polyfunctional acrylates or methacrylates such as epoxy (meth)acrylates formed by the reaction of an epoxy resin with (meth)acrylic acid; and mixtures thereof.

Examples thereof further include a polyfunctional (meth)acrylate obtained by the reaction of a polyfunctional carboxylic acid with a compound having a cyclic ether group and ethylenically unsaturated group (such as glycidyl (meth)acrylate).

Preferable examples of the polymerizable compound that can be used in the invention include compounds having two or more ethylenically unsaturated groups and a fluorene ring, such as those described in JP-A Nos. 2010-160418 and 2010-129825, and Japanese Patent No. 4364216; and a cardo resin.

Examples of the compound which has at least one addition-polymerizable ethylenically unsaturated group and has a boiling point of 100° C. or higher at atmospheric pressure also include compounds such as those described in paragraphs [0254] to [0257] of JP-A No. 2008-292970.

In addition to the above, radical polymerizable monomers represented by the following Formulae (MO-1) to (MO-5) can be suitably used. Here, when T represents an oxyalkylene group, the carbon terminal of the oxyalkylene group is linked to R.

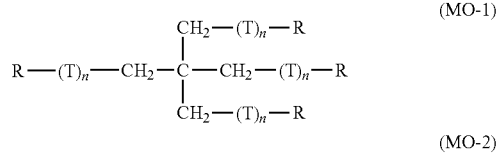

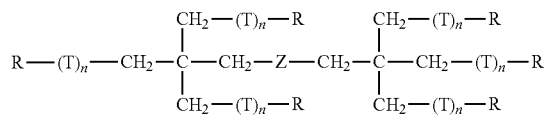

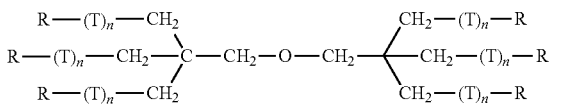

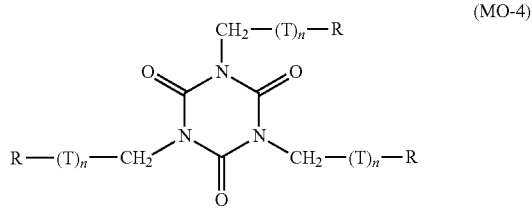

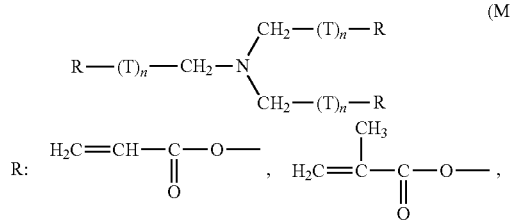

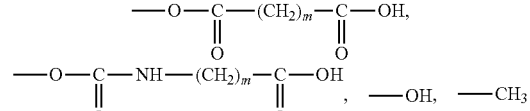

In Formulae (MO-1) to (MO-5), n represents an integer of from 0 to 14, and m represents an integer of from 1 to 8. The plural Rs included in a molecule may be the same as or different from one another. The plural Ts included in a molecule may be the same as or different from one another.

In each of the polymerizable compounds represented by Formulae (MO-1) to (MO-5), at least one of plural Rs is a group represented by —OC(=O)CH=CH$_2$ or —OC(=O)C(CH$_3$)=CH$_2$.

Specific examples of the polymerizable compounds represented by Formulae (MO-1) to (MO-5) include compounds such as those described in paragraphs [0248] to [0251] of JP-A No. 2007-269779.

Further, examples of the polymerizable compound that can be used in the invention include compounds obtained by adding ethyleneoxide or propyleneoxide to a polyfunctional alcohol and (meth)acrylating the resultant adduct, such as those described in Formulae (1) and (2) of JP-A No. 10-62986 with specific examples thereof.

Among these, preferable examples of the polymerizable compound include dipentaerythritol triacrylate (commercially available as KAYARAD D-330, trade name, manufactured by Nippon Kayaku Co., Ltd.), dipentaerythritol tetraacrylate (commercially available as KAYARAD D-320, trade name, manufactured by Nippon Kayaku Co., Ltd.), dipentaerythritol penta(meth)acrylate (commercially available as KAYARAD D-310, trade name, manufactured by Nippon Kayaku Co., Ltd.), dipentaerythritol hexa(meth)acrylate (commercially available as KAYARAD DPHA, trade name, manufactured by Nippon Kayaku Co., Ltd.), and compounds obtained by modifying these commercially-available compounds such that a (meth)acryloyl group thereof is linked via an ethylene glycol or propylene glycol residue. An oligomer of these acrylates may also be used. Hereinbelow, preferable embodiments of the polymerizable compound are described.

The polymerizable compound may be a polyfunctional monomer having an acidic group such as a carboxy group, a sulfonic acid group, or a phosphoric acid group. When the ethylenic compound has an unreacted carboxy group, as in the case of being a mixture described above, the ethylenic compound may be used as it is. However, if necessary, an acidic group may be introduced by the reaction of a hydroxy group of the ethylenic compound with a non-aromatic carboxylic anhydride. In this case, specific examples of the non-aromatic carboxylic anhydride include a tetrahydrophthalic anhydride, an alkylated tetrahydrophthalic anhydride, a hexahydrophthalic anhydride, an alkylated hexahydrophthalic anhydride, a succinic anhydride, and a maleic anhydride.

In the invention, the monomer having an acidic group is an ester of an aliphatic polyhydroxy compound and an unsaturated carboxylic acid, preferably a polyfunctional monomer to which an acidic group is introduced by the reaction of a unreacted hydroxy group of the aliphatic polyhydroxy compound with a non-aromatic carboxylic anhydride, and more preferably an ester in which the aliphatic polyhydroxy compound is pentaerythritol and/or dipentaerythritol. Examples of commercially available products thereof include polybasic acid-modified acryl oligomers such as M-510 and M-520 (trade names, manufactured by TOAGOSEI CO., LTD.).

In the colored radiation-sensitive composition of the invention, these polymerizable compounds may be used singly. However, since it is difficult to obtain a single kind of compound in the production of polymerizable compounds, two or more kinds of polymerizable compound may be used in combination.

If necessary, a polyfunctional monomer having no acidic group and a polyfunctional monomer having an acidic group may be used in combination as a polymerizable compound.

The acid value of polyfunctional monomer having an acidic group is preferably from 0.1 mg KOH/g to 40 mg KOH/g, and more preferably from 5 mg KOH/g to 30 mg KOH/g. When the acid value of the polyfunctional monomer is 0.1 mg KOH/g or more, sufficient solubility in a developer can be obtained. When the acid value of the polyfunctional monomer is 40 mg KOH/g or less, production or handling thereof is facilitated, whereby sufficient photopolymerization properties can be obtained and excellent curing properties for improving the surface smoothness of a pixel or the like can be achieved. Accordingly, when two or more kinds of polyfunctional monomer having different acidic values are used in combination, or when a polyfunctional monomer having no acidic group and a polyfunctional monomer having an acidic group are used in combination, it is preferable to adjust the overall acid value of the polyfunctional monomers such that it falls within the above ranges.

Further, in a preferable embodiment, the colored radiation-sensitive composition of the invention includes a polyfunctional monomer having a caprolactone structure as the polymerizable compound.

The polymerizable compound having a caprolactone structure is not specifically limited, as long as it has a caprolactone structure within the molecule thereof. Examples thereof include ε-caprolactone-modified polyfunctional (meth)acrylates which are obtained by esterification of a polyhydric alcohol such as trimethylol ethane, ditrimethylol ethane, trimethylol propane, ditrimethylol propane, pentaerythritol, dipentaerythritol, tripentaerythritol, glycerin, diglycerol, or trimethylol melamine, with (meth)acrylate and ε-caprolactone. Among these, the polyfunctional monomer having a caprolactone structure represented by the following Formula (Z-1) is preferable.

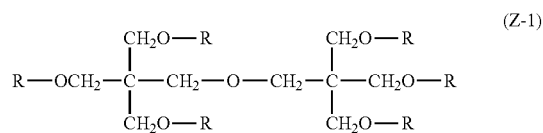

In Formula (Z-1), all of the six Rs each represent a group represented by the following Formula (Z-2), or one to five among the six Rs represent(s) a group represented by the following Formula (Z-2), and the rest thereof represents a group represented by the following Formula (Z-3).

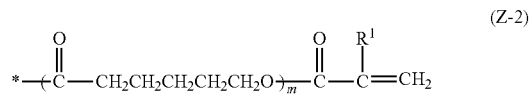

In Formula (Z-2), $R^1$ represents a hydrogen atom or a methyl group, m represents a number of 1 or 2, and the "*" sign represents a bonding site.

In Formula (Z-3), $R^1$ represents a hydrogen atom or a methyl group, and the "*" sign represents a bonding site.

These polyfunctional monomers having a caprolactone structure are commercially available, for example, as KAYARAD DPCA series (trade name, manufactured by Nippon Kayaku Co., Ltd.), for example. Examples thereof include DPCA-20 (a compound in which m in Formulae (Z-1) to (Z-3) is 1, the number of groups represented by Formula (Z-2) is 2, and each $R^1$ represents a hydrogen atom), DPCA-30 (a compound in which m in Formulae (Z-1) to (Z-3) is 1, the number of groups represented by Formula (Z-2) is 3, each $R^1$ represents a hydrogen atom), DPCA-60 (a compound in which m in Formulae (Z-1) to (Z-3) is 1, the number of groups represented by Formula (Z-2) is 6, and each $R^1$ represents a hydrogen atom), and DPCA-120 (a compound in which m in Formulae (Z-1) to (Z-3) is 2, the number of groups represented by Formula (Z-2) is 6, each $R^1$ represents a hydrogen atom) (trade names, manufactured by Nippon Kayaku Co., Ltd.).

In the invention, the polyfunctional monomers having a caprolactone structure may be used singly or as a mixture of two or more kinds thereof.

The polymerizable compound according to the invention is preferably a polymerizable compound that contains an alkyleneoxy group having 2 or more carbon atoms (such as an ethyleneoxy group, a propyleneoxy group, or a butyleneoxy group).

Among the polymerizable compounds that contain an alkyleneoxy group having 2 or more carbon atoms, at least one selected from the group consisting of compounds represented by following Formula (i) or (ii) is preferable.

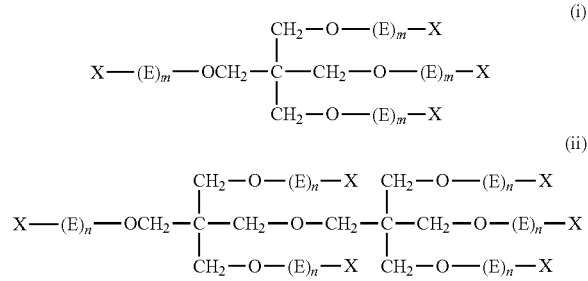

In Formulae (i) and (ii), each E independently represents $-((CH_2)_yCH_2O)-$ or $-((CH_2)_yCH(CH_3)O)-$; in which each y independently represents an integer of from 0 to 10; and each X independently represents an acryloyl group, a methacryloyl group, a hydrogen atom, or a carboxy group.

In Formula (i), the sum of the number of the acryloyl groups and the number of the methacryloyl groups represented by X is three or four; each m independently represents an integer of from 0 to 10; and the sum of all the numbers of m is an integer of from 0 to 40. However, any one of Xs represents a carboxy group when the sum of all the numbers of m is 0.

In Formula (ii), the sum of the number of the acryloyl groups and the number of the methacryloyl groups represented by X is five or six; each n independently represents an integer of from 0 to 10; and the sum of all the numbers of n is an integer of from 0 to 60. However, any one of Xs represents a carboxy group when the sum of all the numbers of n is 0.

In Formula (i), m preferably represents an integer of from 0 to 6, and more preferably an integer of from 0 to 4. Further, the sum of all the numbers of m is preferably an integer of from 2 to 40, more preferably an integer of from 2 to 16, and still more preferably an integer of from 4 to 8.

In Formula (ii), n preferably represents an integer of from 0 to 6, and more preferably an integer of from 0 to 4. Further, the sum of all the numbers of n is preferably an integer of from 3 to 60, more preferably an integer of from 3 to 24, and still more preferably an integer of from 6 to 12.

It is preferable that the terminal at the oxygen atom side of $-((CH_2)_yCH_2O)-$ or $-((CH_2)_yCH(CH_3)O)-$ in Formula (i) or (ii) is bonded to X.

The compound represented by Formula (i) or (ii) may be used singly or in combination of two or more kinds thereof. It is more preferable that all of the six Xs in Formula (ii) represent an acryloyl group.

The compound represented by Formula (i) or (ii) may be synthesized by a conventionally known process including a process of linking an ring-opened skeleton to pentaerythritol or dipentaerythritol by the ring-opening addition reaction with ethyleneoxide or propyleneoxide, and a process of introducing a (meth)acryloyl group into the terminal hydroxy group of the ring-opened skeleton, for example, by the reaction with (meth)acryloyl chloride. The respective processes are well known processes, and those skilled in the art may easily synthesize the compound represented by Formula (i) or (ii).

Among the compounds represented by Formula (i) or (ii), pentaerythritol derivatives and/or dipentaerythritol derivatives are preferable.

Specific examples thereof include compounds represented by the following Formulae (a) to (f) (hereinbelow, also referred to as "Exemplary compounds (a) to (f)"). Among these, Exemplary compounds (a), (b), (e), and (f) are preferable.

In particular, Exemplary compound (b) is effective as a polymerizable compound, and it can significantly improves the effects of the invention.

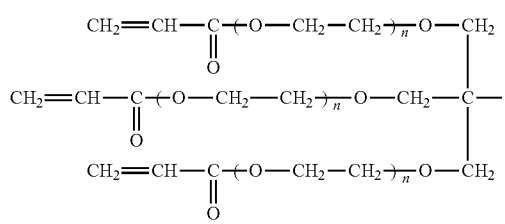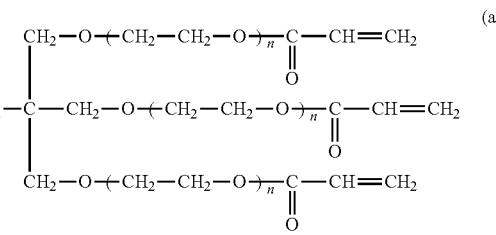

(a)

(Sum of the numbers represented by respective n's is 6.)

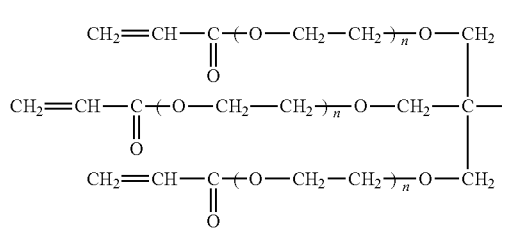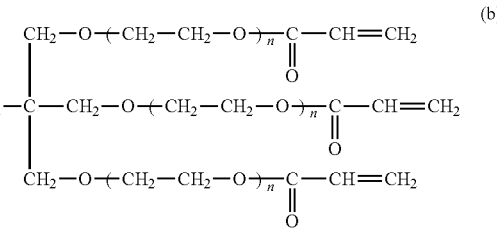

(b)

(Sum of the numbers represented by respective n's is 12.)

-continued

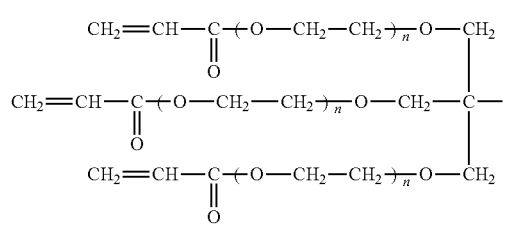 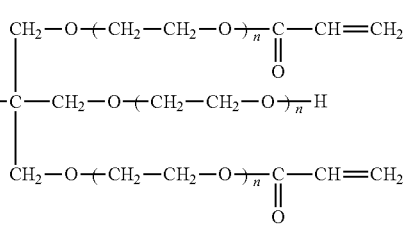

(c)

(Sum of the numbers represented by respective n's is 12.)

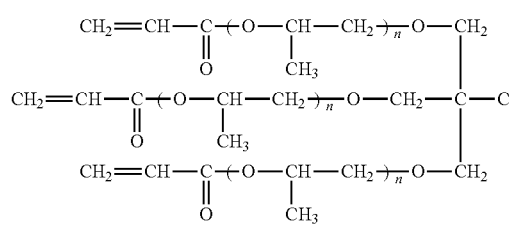 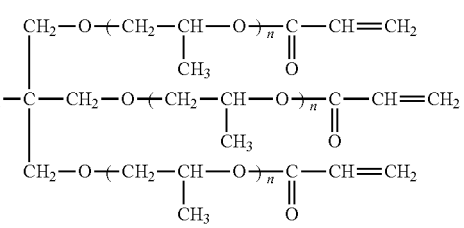

(d)

(Sum of the numbers represented by respective n's is 6.)

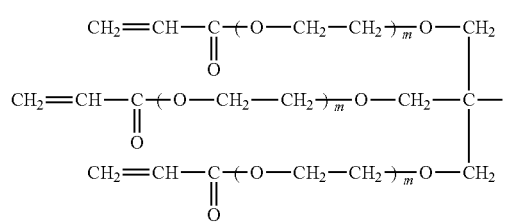 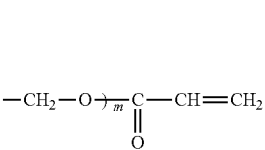

(e)

(Sum of the numbers represented by respective m's is 4.)

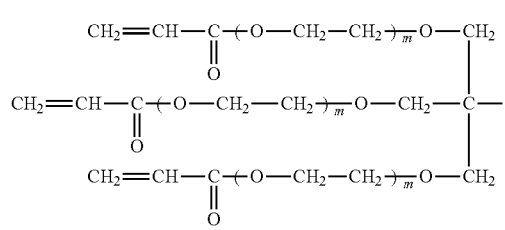 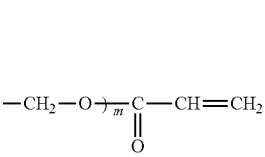

(f)

(Sum of the numbers represented by respective m's is 12.)

Examples of commercially available products of the polymerizable compound represented by Formula (i) or (ii) include SR-494 (trade name, manufactured by Sartomer Company), that is a tetrafunctional acrylate having four ethyleneoxy chains; and DPCA-60, that is hexafunctional acrylate having six pentyleneoxy chains, and TPA-330, that is trifunctional acrylate having three isobutyleneoxy chains (trade names, manufactured by Nippon Kayaku Co., Ltd.).

Furthermore, as the polymerizable compound, photocurable monomers or oligomers such as those described in Journal of the Adhesion Society of Japan Vol. 20, No. 7, pp. 300-308 (1984) may be used.

The content of the polymerizable compound in the colored radiation-sensitive composition of the invention is preferably from 2% by mass to 50% by mass, more preferably from 2% by mass to 30% by mass, and still more preferably from 2% by mass to 25% by mass, with respect to a total solid content of the composition.

(D) Ultraviolet Absorber

It is preferable that the colored radiation-sensitive composition of the invention further includes (D) an ultraviolet absorber.

The ultraviolet absorber is preferably a compound whose absorption coefficient per gram exceeds 100 at a wavelength of 365 nm and is 10 or less at a wavelength of 400 nm or more. Here, the absorption coefficient of the compound is a value determined by using an ultraviolet/visible light spectrophotometer (trade name: CARRY-5 SPECTROPHOTOMETER, manufactured by Varian Inc) at a concentration of 0.01 g/L using an ethyl acetate as a solvent.

The absorption coefficient per gram exceeding 100 at a wavelength of 365 nm is preferable because the amount of the ultraviolet absorber to be added to the colored radiation-sensitive composition in order to obtain the ultraviolet absorption effect is decreased, and thus the likelihood of successful formulation of the ultraviolet absorber is increased. The absorption coefficient per gram of 10 or less at a wavelength of 400 nm or more is preferable because the influence on the device spectrum in the visible region is suppressed.

The ultraviolet absorber in the invention is preferably a compound represented by the following Formula (I), which is a conjugated diene compound. When this conjugated diene compound is used, the fluctuation in the development performance especially after performing the exposure with a low illuminance can be suppressed, whereby the dependency on the exposure illuminance that relates to pattern formability such as a line width of a pattern, a film thickness, or an optical spectrum can be effectively reduced.

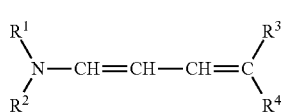

Formula (I)

In Formula (I), $R^1$ and $R^2$ each independently represent a hydrogen atom, an alkyl group having 1 to 20 carbon atoms, or an aryl group having 6 to 20 carbon atoms. $R^1$ and $R^2$ may be the same as or different from each other, but $R^1$ and $R^2$ do not simultaneously represent a hydrogen atom.

Examples of the alkyl group having 1 to 20 carbon atoms, which is represented by $R^1$ or $R^2$, include a methyl group, an ethyl group, a propyl group, an n-butyl group, an n-hexyl group, a cyclohexyl group, an n-decyl group, an n-dodecyl group, an n-octadecyl group, an eicosyl group, a methoxyethyl group, an ethoxypropyl group, a 2-ethylhexyl group, a hydroxyethyl group, a chloropropyl group, an N,N-diethylamino propyl group, a cyanoethyl group, a phenethyl group, a benzyl group, a p-t-butylphenethyl group, a p-t-octylphenoxyethyl group, a 3-(2,4-di-t-amylphenoxy)propyl group, an ethoxycarbonylmethyl group, a 2-(2-hydroxyethoxy)ethyl group, and a 2-furylethyl group. Among these, a methyl group, an ethyl group, a propyl group, an n-butyl group, and an n-hexyl group are preferable.

The alkyl group, which is represented by $R^1$ or $R^2$, may have a substituent. Examples of the substituent of the substituted alkyl group include an alkyl group, an aryl group, an alkoxy group, an aryloxy group, an acyloxy group, a halogen atom, an acylamino group, an acyl group, an alkylthio group, an arylthio group, a hydroxy group, a cyano group, an alkyloxy carbonyl group, an aryloxycarbonyl group, a substituted carbamoyl group, a substituted sulfamoyl group, a nitro group, a substituted amino group, an alkyl sulfonyl group, and an aryl sulfonyl group.

The aryl group having 6 to 20 carbon atoms, which is represented by $R^1$ or $R^2$, may be a monocyclic or condensed ring, and may be a substituted aryl group or an unsubstituted aryl group. Examples thereof include a phenyl group, a 1-naphthyl group, a 2-naphthyl group, an anthryl group, a phenanthryl group, an indenyl group, an acenabutenyl group, and a fluorenyl group. Examples of the substituent of substituted aryl group include an alkyl group, an aryl group, an alkoxy group, an aryloxy group, an acyloxy group, a halogen atom, an acylamino group, an acyl group, an alkylthio group, an arylthio group, a hydroxy group, a cyano group, an alkyloxy carbonyl group, an aryloxy carbonyl group, a substituted carbamoyl group, a substituted sulfamoyl group, a nitro group, a substituted amino group, an alkyl sulfonyl group, and an aryl sulfonyl group. Among these, a substituted or unsubstituted phenyl group, a 1-naphthyl group, and a 2-naphthyl group are preferable.

$R^1$ and $R^2$ may form a cyclic amino group together with the nitrogen atom to which $R^1$ and $R^2$ are linked. Examples of the cyclic amino group include a piperidino group, a morpholino group, a pyrrolidino group, a hexahydroazepino group, and a piperazino group.

Among these, as $R^1$ and $R^2$, a lower alkyl group having 1 to 8 carbon atoms (such as a methyl group, an ethyl group, an isopropyl group, a butyl group, a sec-butyl group, a tert-butyl group, a pentyl group, a tert-pentyl group, a hexyl group, an octyl group, a 2-ethylhexyl group, or a tert-octyl group), and a substituted or unsubstituted phenyl group (such as a tolyl group, a phenyl group, an anisyl group, a mesityl group, a chlorophenyl group, or a 2,4-di-t-amylphenyl group) are preferable. It is also preferable that $R^1$ and $R^2$ are linked to each other together with the nitrogen atom represented by N in Formula (I) to form a ring (such as a piperidine ring, a pyrrolidine ring, or a morpholine ring).

In Formula (I), $R^3$ and $R^4$ represent an electron withdrawing group. Here, the electron withdrawing group is an electron withdrawing group whose Hammett substituent constant $\sigma_p$ value (hereinafter, simply referred to as "$\sigma_p$ value") is from 0.20 to 1.0. The $\sigma_p$ value is preferably from 0.30 to 0.8.

The Hammett rule is an experimental rule which was proposed by L. P. Hammett in 1935 in order to quantitatively discuss an influence of a substituent group on a reaction or equilibrium of benzene derivatives. The validity of this rule is widely admitted these days. Substituent constants obtained by the Hammett rule include $\sigma_p$ value and $\sigma_m$ value, and description regarding these values can be found in many general books. For example, the description thereof can be found in "Lange's Handbook of Chemistry" 12th edition, edited by J. A. Dean, 1979 (McGraw-Hill), "Kagaku-no-Ryoiki (Journal of Japanese Chemistry) special edition", Vol. 122, pp. 96-103, 1979 (Nankodo), and "Chemical Reviews", Vol. 91, pp. 165-195, 1991. In the invention, it does not mean that the substituent of the invention is not limited to substituents with values known by these documents. It is understood that, as long as the value of the substituent is within the above ranges when measured based on the Hammett rule, the substituent with such value may be included in the electron withdrawing group even when the value is not known by these documents.

Specific examples of the electron withdrawing group with the $\sigma_p$ value of from 0.20 to 1.0 include an acyl group, an acyloxy group, a carbamoyl group, an alkyloxy carbonyl group, an aryloxy carbonyl group, a cyano group, a nitro group, a dialkyl phosphono group, a diaryl phosphono group, a diaryl phosphinyl group, an alkyl sulfinyl group, an aryl sulfinyl group, an alkyl sulfonyl group, an aryl sulfonyl group, a sulfonyloxy group, an acylthio group, a sulfamoyl group, a thiocyanate group, a thiocarbonyl group, an alkyl group substituted with at least two or more halogen atoms, an alkoxy group substituted with at least two or more halogen atoms, an aryloxy group substituted with at least two or more halogen atoms, an alkylamino group substituted with at least two or more halogen atoms, an alkylthio group substituted with at least two or more halogen atoms, and an aryl group, a heterocyclic group, a chlorine atom, a bromine atom, an azo group, or a selenocyanate group substituted with another electron withdrawing group having a $\sigma_p$ value of 0.20 or more. Among these substituents, substituents that can further have a substituent may further have a substituent as described above.

Among these, in the invention, $R^3$ is preferably a group selected from a cyano group, —$COOR^5$, —$CONHR^5$, —COR⁵, and —SO₂R⁵; and R⁴ is preferably a group selected from a cyano group, —COOR⁶, —CONHR⁶, —COR⁶, and —SO₂R⁶. $R^5$ and $R^6$ each independently represent an alkyl group having 1 to 20 carbon atoms, or an aryl group having 6 to 20 carbon atoms. The alkyl group having 1 to 20 carbon atoms and the aryl group having 6 to 20 carbon atoms, which are represented by $R^5$ or $R^6$, have the same definitions and preferable definitions as $R^1$ and $R^2$, respectively.

Among these, $R^3$ and $R^4$ are preferably an acyl group, a carbamoyl group, an alkyloxy carbonyl group, an aryloxy carbonyl group, a cyano group, a nitro group, an alkyl sulfonyl group, an aryl sulfonyl group, a sulfonyloxy group, or a sulfamoyl group; and more preferably an acyl group, a carbamoyl group, an alkyloxy carbonyl group, an aryloxycarbonyl group, a cyano group, alkyl sulfonyl group, an aryl sulfonyl group, a sulfonyloxy group, or a sulfamoyl group.

Furthermore, $R^3$ and $R^4$ may be linked to each other to form a ring.

At least one of $R^1$, $R^2$, $R^3$, or $R^4$ may be a form of a polymer derived from a monomer connected with a vinyl group via a linking group, or may be a copolymer formed with another monomer.

When the at least one of $R^1$, $R^2$, $R^3$, or $R^4$ is a copolymer, examples of the another monomer include acrylic acids, α-chloroacrylic acids, α-alkylacrylic acids (for example, esters derived from acrylic acids such as a methacrylic acid, preferably lower alkyl esters and an amides (such as acrylamide, methacrylamide, t-butyl acrylamide, methyl acrylate, methyl methacrylate, ethyl acrylate, ethyl methacrylate, n-propyl acrylate, n-butyl acrylate, 2-ethylhexyl acrylate, n-hexyl acrylate, octyl methacrylate, lauryl methacrylate, or methylene bisacrylamide)), vinylesters (for example, vinyl acetate, vinyl propionate, and vinyl laurate), acrylonitrile, methacrylonitrile, aromatic vinyl compounds (for example, styrene and derivatives thereof, such as vinyl toluene, divinyl benzene, vinyl acetophenone, sulfostyrene, and styrene sulfinic acid), itaconic acid, citraconic acid, crotonic acid, vinylidene chloride, vinyl alkyl ethers (such as vinyl ethyl ether), maleic acid esters, N-vinyl-2-pyrrolidone, N-vinyl pyridine, and 2-vinyl pyridine and 4-vinyl pyridine.

Among these, acrylic acid esters, methacrylic acid esters, and aromatic vinyl compounds are preferable.

Two or more kinds of monomer compound may be used in combination. For example, a combination of n-butyl acrylate and divinyl benzene, a combination of styrene and methyl methacrylate, or a combination of methyl acrylate and methacrylic acid may be used.

Hereinbelow, specific examples (Exemplary compounds (1) to (14)) of the preferable compound represented by Formula (I) are shown. However, the invention is not limited thereto.

(1)
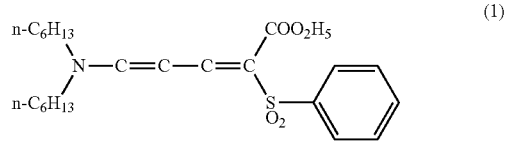

(2)
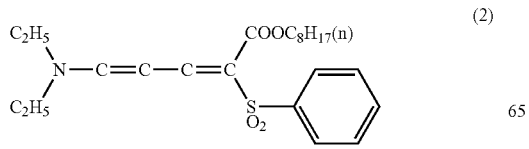

(3)
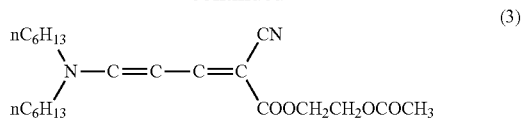

(4)
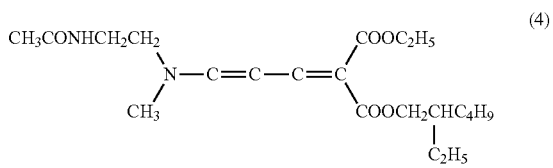

(5)
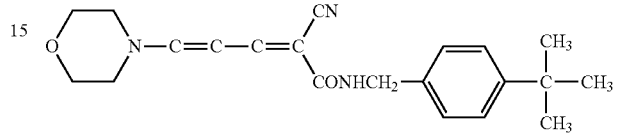

(6)
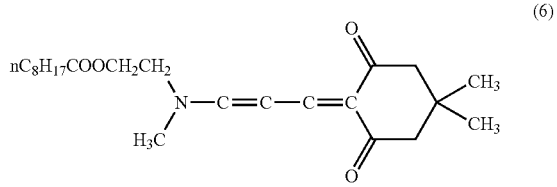

(7)
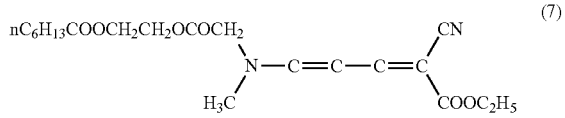

(8)
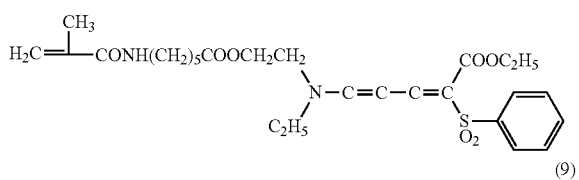

(9)
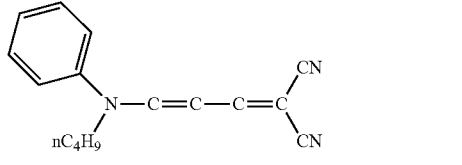

(10)
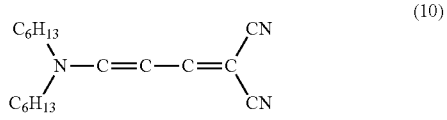

(11)
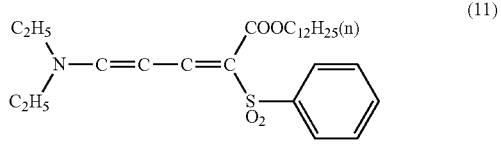

(12)
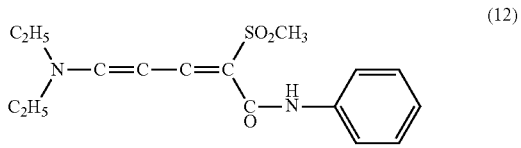

(13)
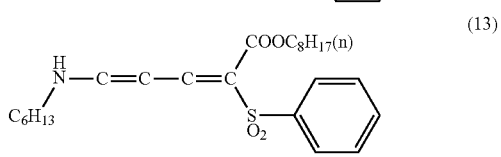

-continued

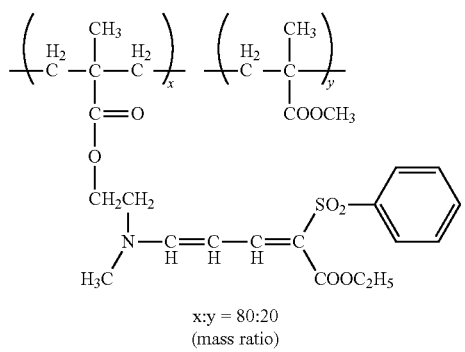

x:y = 80:20
(mass ratio)

The compound represented by Formula (I) can be synthesized by a method as described in JP-B No. 44-29620, JP-A No. 53-128333, 61-169831, 63-53543, 63-53544, or 63-56651.

Hereinbelow, a method for synthesizing Exemplary compound (1) as a representative compound of the present invention is described in detail.

Specifically, 3-anilinoacrolein anil (13.3 g) and ethyl(phenylsulfonyl)acetate (14.3 g) in acetic anhydride (40 ml) are heated to a range of from 85° C. to 90° C. for 2 hours. The acetic anhydride is removed by drying under reduced pressure, and then ethanol (40 ml) and di-n-hexylamine (24.1 g) are added thereto. The mixture is then refluxed for 2 hours. After removing the ethanol, the residue is purified with column chromatography, and then recrystallized with ethanol, thereby obtaining an intended product (melting point: 95° C. to 96° C.).

In the invention, these ultraviolet absorbers may be used singly or in combination of two or more kinds thereof.

The colored radiation-sensitive composition may or may not include the ultraviolet absorber. When the composition includes the ultraviolet absorber, the content of the ultraviolet absorber is preferably from 0.01% by mass to 10% by mass, and more preferably from 0.01% by mass to 5% by mass, with respect to a total solid content of the colored radiation-sensitive composition.

When the content of the ultraviolet absorber is within the above ranges, sidewall roughness of a color pattern is suppressed, and a minute pattern shape (in particular, a rectangular shape) can be formed precisely and reduction in sensitivity can be suppressed.

The mass ratio (D/B) of (D) the ultraviolet absorber with respect to (B) the photopolymerization initiator is from 0.25 to 1.25. When the mass ratio (D/B) is 0.25 or more, sidewall roughness of the color pattern is suppressed, and a minute pattern shape (in particular, a rectangular shape) can be formed precisely. When the mass ratio (D/B) is 1.25 or less, reduction in sensitivity can be suppressed. From the same reason as described above, the mass ratio (D/B) is preferably in a range of from 0.3 to 1.1, and more preferably in a range of from 0.4 to 1.0.

In general, changes in a color pattern shape are noticeable when the pattern is formed using a curable composition of magenta or red color by which i-line is less absorbed. Accordingly, the ultraviolet absorber is effective when it is used for a colored radiation-sensitive composition of magenta or red color.

The colored radiation-sensitive composition of the invention may further include a component such as (E) an alkali-soluble resin, an organic solvent, or a surfactant.

(E) Alkali-Soluble Resin

It is preferable that the colored radiation-sensitive composition further contains (E) an alkali-soluble resin. When the colored radiation-sensitive composition contains the alkali-soluble resin, developability and pattern formability can be improved.

The alkali-soluble resin may be a linear organic polymer, and may be suitably selected from alkali-soluble resins which have at least one group, that is capable of enhancing alkali solubility, in the molecule (preferably, a molecule that contains an acrylic copolymer or styrene copolymer as the main chain).

The alkali-soluble resin is described hereinbelow.

From the viewpoint of heat resistance, the alkali-soluble resin is preferably a polyhydroxy styrene resin, a polysiloxane resin, an acrylic resin, an acrylamide resin, or an acryl/acrylamide copolymer resin. From the viewpoint of controlling the developability, an acrylic resin, an acrylamide resin, or an acryl/acrylamide copolymer resin is preferable.

Examples of the group that is capable of enhancing alkali solubility (hereinbelow, may be referred to as an "acidic group") include a carboxy group, a phosphoric acid group, a sulfonic acid group, and a phenolic hydroxy group. An alkali-soluble resin which is soluble in an organic solvent and developable by a weakly alkali aqueous solution is preferable, and (meth)acrylate is more preferable. The acidic groups may be used singly or in combination of two or more kinds thereof.

Examples of a monomer capable of introducing an acidic group after polymerization include a monomer having a hydroxy group such as 2-hydroxyethyl (meth)acrylate, a monomer having an epoxy group such as glycidyl (meth)acrylate, and a monomer having an isocyanate group such as 2-isocyanatoethyl (meth)acrylate. These monomers used for introducing the acidic group may be used singly or in combination two or more kinds thereof. In order to introduce an acidic group into an alkali-soluble binder, for example, a monomer having an acidic group and/or a monomer capable of introducing an acidic group after polymerization (hereinbelow, may be referred to as a "monomer for introducing an acidic group") are used as monomer components for polymerization. It should be noted that, when a monomer capable of introducing an acidic group after polymerization is used as a monomer component to introduce an acidic group, it is necessary to perform, for example, a treatment for introducing an acidic group as described below, after polymerization.

For example, a known radical polymerization method is applicable for the production of the alkali-soluble resin. When the alkali-soluble resin is produced by a radical polymerization method, the polymerization conditions such as temperature, pressure, the type and amount of radical initiator, the type of solvent, and the like may easily be determined by those skilled in the art, and the conditions may be derived experimentally.

The alkali-soluble resin is preferably a resin having a carboxylic acid group in a side chain thereof. Examples thereof include a methacrylic acid copolymer, an acrylic acid copolymer, an itaconic acid copolymer, a crotonic acid copolymer, a maleic acid copolymer, a partially esterified maleic acid copolymer, and an alkali-soluble phenolic resin such as Novolac resin, as well as an acidic cellulose derivative having a carboxylic acid group in a side chain thereof, and a compound obtained by adding an acid anhydride to a polymer having a hydroxy group. Particularly, a copolymer obtained by using (meth)acrylic acid and another monomer copolymerizable with (meth)acrylic acid is preferable as the alkali-soluble resin. Examples of the another monomer copolymerizable with (meth)acrylic acid include an alkyl (meth)

acrylate, an aryl (meth)acrylate, and a vinyl compound. Examples of the alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyltoluene, glycidyl methacylate, acrylonitrile, vinyl acetate, N-vinylpyrrolidone, tetrahydrofurfuryl methacrylate, a polystyrene macromonomer, a polymethyl methacrylate macromonomer, and an N-substituted maleimide monomer such as N-phenylmaleimide or N-cyclohexylmaleimide, described in JP-A No. 10-300922. These additional monomers that can copolymerize with (meth)acrylic acid may be used singly or in combination of two or more kinds thereof.

The alkali-soluble phenol resin may be suitably used when the colored radiation-sensitive composition of the invention is prepared as a positive-working composition. Examples of the alkali soluble phenol resin include a Novolac resin and a vinyl polymer.

Examples of the Novolac resin include those obtained by condensation of phenols and aldehydes in the presence of an acid catalyst. Examples of the phenols include phenol, cresol, ethyl phenol, butyl phenol, xylenol, phenyl phenol, catechol, resorcinol, pyrogallol, naphthol, and bisphenol A.

Examples of the aldehydes include formaldehyde, paraformaldehyde, acetaldehyde, propionaldehyde, and benzaldehyde.

The phenols and aldehydes may be used singly or in combination of two or more kinds thereof, respectively.

Specific examples of the Novolac resin include a product obtained by condensation between metacresol, paracresol, or a mixture thereof and formalin.

The molecular weight distribution of the Novolac resin may be controlled by a method such as fractionation. Furthermore, a low molecular weight component having a phenolic hydroxy group such as bisphenol C or bisphenol A may be also added to the Novolac resin.

In order to improve the crosslinking efficiency of the colored radiation-sensitive composition of the invention, an alkali-soluble resin having a polymerizable group may be used. Examples of the alkali-soluble resin having a polymerizable group include an alkali-soluble resin which contains in a side chain thereof an allyl group, a (meth)acryl group, or an allyloxy alkyl group.

Examples of the polymer having a polymerizable group as described above include DIANAL NR series (trade name, manufactured by Mitsubishi Rayon Co., Ltd.), COOH-containing polyurethane acrylic oligomer PHOTOMER 6173 (trade name, manufactured by Diamond Shamrock Co. Ltd.), VISCOAT R-264 and KS RESIST 106 (trade names, manufactured by Osaka Organic Chemical Industry Ltd.), CYCLOMER P series and PLACCEL CF200 series (trade names, manufactured by Daicel Corporation), and EBECRYL 3800 (trade name, manufactured by Daicel-UCB Co., Ltd.).

Preferable examples of the alkali-soluble resin having a polymerizable group include a urethane-modified polymerizable double bond-containing acrylic resin, which is obtained by the reaction of an acrylic resin having a carboxyl group with a compound in which isocyanate groups and OH groups have been reacted with each other in advance to leave one unreacted isocyanate group and which has a (meth)acryloyl group; an unsaturated group-containing acrylic resin, which is obtained by the reaction of an acrylic resin having a carboxy group with a compound having both an epoxy group and a polymerizable double bond in the molecule; an acid-pendant epoxy acrylate resin; a polymerizable double bond containing acrylic resin, which is obtained by the reaction of an acrylic resin containing OH group with a dibasic acid anhydride having a polymerizable double bond; a resin obtained by the reaction of acrylic resin containing OH group with a compound having a isocyanate group and a polymerizable group; and a resin obtained by subjecting a resin having, in a side chain thereof, an ester group having a leaving group such as a halogen atom or a sulfonate group at the α- or β-position to a basic treatment, such as those described in JP-A Nos. 2002-229207 and 2003-335814.

Preferable examples of the alkali-soluble resin include a benzyl (meth)acrylate/(meth)acrylic acid copolymer and a multi-component copolymer of benzyl (meth)acrylate/(meth)acrylic acid/another monomer. Preferable examples of the alkali-soluble resin further include a copolymer obtained by copolymerizing 2-hydroxyethyl methacrylate; and a 2-hydroxypropyl (meth)acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, and a 2-hydroxyethyl methacrylate/polystyrene macromonomer/benzyl methacrylate/methacrylic acid copolymer, such as those described in JP-A No. 7-140654.

The alkali-soluble resin preferably contains (a) a polymer obtained by the polymerization of a monomer component that is essentially includes a compound represented by the following Formula (ED) (hereinbelow, may be referred to as "ether dimer").

By containing (a) the polymer, the colored radiation-sensitive composition of the invention provides a cured coating film having an excellent transparency together with a significantly excellent heat resistance.

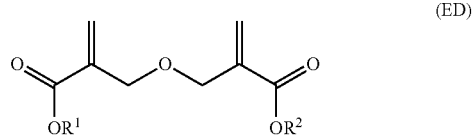

(ED)

In Formula (ED), $R^1$ and $R^2$ each independently represent a hydrogen atom or a hydrocarbon group having 1 to 25 carbon atoms which may have a substituent.

In Formula (ED), the hydrocarbon group having 1 to 25 carbon atoms which may have a substituent group, which is represented by $R^1$ or $R^2$, is not specifically limited, and examples thereof include a linear or branched alkyl group such as a methyl group, an ethyl group, an n-propyl group, an isopropyl group, an n-butyl group, an isobutyl group, a t-butyl group, a t-amyl group, a stearyl group, a lauryl group, or a 2-ethylhexyl group; an aryl group such as a phenyl group; an alicyclic group such as a cyclohexyl group, a t-butyl cyclohexyl group, a dicyclopentadienyl group, a tricyclodecanyl group, an isobornyl group, an adamantyl group, or a 2-methyl-2-adamantyl group; an alkyl group substituted by an alkoxy group, such as a 1-methoxyethyl group or a 1-ethoxyethyl group; and an alkyl group substituted by an aryl group such as a benzyl group. Among these, a substituent of primary or secondary carbon, which is hardly dissociable by acid or heat, such as a methyl group, an ethyl group, a cyclohexyl group, or a benzyl group is preferable, in view of heat resistance.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis(methylene)]bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate. Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are preferable. These ether dimers may be used singly or in combination of two or more kinds thereof.

The content of the ether dimer in monomers used for obtaining (athe polymer is not specifically limited, but preferably from 2% by mass to 60% by mass, more preferably from 5% by mass to 55% by mass, and still more preferably from 5% by mass to 50% by mass, with respect to a total mass of the monomer components, from the viewpoints of transparency and heat resistance of a coating film to be formed using the colored radiation-sensitive composition of the invention.

(a) The polymer may be a copolymer obtained by copolymerization of an ether dimer with another monomer.

Examples of the another monomer that can be copolymerized with the ether dimer include a monomer for introducing an acidic group, a monomer for introducing a radical polymerizable double bond, a monomer for introducing an epoxy group, and other copolymerizable monomers. These monomers may be used singly or in combination of two or more kinds thereof.

Examples of the monomer for introducing an acidic group include a monomer having a carboxy group such as (meth)acrylaic acid or itaconic acid, a monomer having a phenolic hydroxy group such as N-hydroxyphenyl maleimide, and a monomer having a carboxylic anhydride group such as maleic anhydride or itaconic anhydride. Among these, (meth)acrylic acid is preferable.

The monomer for introducing an acidic group may be a monomer capable of imparting an acidic group after polymerization, and examples thereof include a monomer having a hydroxy group such as 2-hydroxyethyl (meth)acrylate, a monomer having an epoxy group such as glycidyl (meth)acrylate, and a monomer having an isocyanate group such as 2-isocyantoethyl (meth)acrylate. When a monomer capable of providing an acidic group after polymerization is used, it is necessary to perform a treatment for introducing an acidic group after polymerization. The treatment for providing an acidic group after polymerization varies depending on the type of a monomer, and examples of the treatment include the followings. When a monomer having a hydroxy group is used, a treatment in which an acid anhydride such as succinic anhydride, tetrahydrophthalic anhydride, or maleic anhydride is added may be employed. When a monomer having an epoxy group is used, a treatment in which a compound having an amino group and an acidic group, such as N-methylamino benzoic acid or N-methylamino phenol is added, or a treatment in which acid such as (meth)acrylic acid is added to produce a hydroxy group, and then an acid anhydride such as succinic anhydride, tetrahydrophthalic anhydride, or maleic anhydride is added to the generated hydroxy group may be employed. When a monomer having an isocyanate group is used, a treatment in which a compound having both a hydroxy group and an acidic group such as 2-hydroxy butyric acid is added may be employed.

When the monomer used for obtaining (a) the polymer contains the monomer for introducing an acidic group, the content thereof is not specifically limited, but preferably from 5% by mass to 70% by mass, and more preferably from 10% by mass to 60% by mass, with respect to a total mass of the monomer components.

Examples of the monomer for introducing a radical polymerizable double bond include a monomer having a carboxy group such as (meth)acrylic acid or itaconic acid; a monomer having a carboxylic anhydride group such as maleic anhydride or itaconic anhydride; and a monomer having an epoxy group such as glycidyl (meth)acrylate, 3,4-epoxy cyclohexyl methyl (meth)acrylate, or o-, m- or p-vinyl benzyl glycidyl ether. When the monomer for introducing a radical polymerizable double bond is used, it is necessary to perform a treatment for introducing a radical polymerizable double bond after polymerization. The treatment for introducing a radical polymerizable double bond after polymerization varies depending on the type of a monomer used for introducing a radical polymerizable double bond, and examples of the treatment include the followings. When a monomer having a carboxy group such as (meth)acrylic acid or itaconic acid is used, a treatment in which a compound having an epoxy group and a radical polymerizable double bond, such as glycidyl (meth)acrylate, 3,4-epoxy cyclohexyl methyl (meth)acrylate, or o-, m- or p-vinyl benzyl glycidyl ether, is added may be employed. When a monomer having a carboxylic anhydride group such as maleic anhydride or itaconic anhydride is used, a treatment in which a compound having a hydroxy group and a radical polymerizable double bond, such as 2-hydroxyethyl (meth)acrylate, is added may be employed. When a monomer having an epoxy group such as glycidyl (meth)acrylate, 3,4-epoxy cyclohexyl methyl (meth)acrylate, or o-, m- or p-vinyl benzyl glycidyl ether is used, a treatment in which a compound having an acidic group and a radical polymerizable double bond, such as (meth)acrylic acid, is added may be employed.

When the monomer for obtaining (a) the polymer contains a monomer for introducing a radical polymerizable double bond, the content thereof is not specifically limited, but preferably from 5% by mass to 70% by mass, and more preferably from 10% by mass to 60% by mass, with respect to a total mass of the monomer components.

Examples of the monomer for introducing an epoxy group include glycidyl (meth)acrylate, 3,4-epoxy cyclohexyl methyl (meth)acrylate, and o-vinyl benzyl glycidyl ether, m-vinyl benzyl glycidyl ether, and p-vinyl benzyl glycidyl ether.

When the monomer for obtaining (a) the polymer contains a monomer for introducing an epoxy group, the content thereof is not specifically limited, but preferably from 5% by mass to 70% by mass, and more preferably from 10% by mass to 60% by mass, with respect to a total mass of the monomer components.

Examples of other copolymerizable monomers include (meth)acrylate esters such as methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, methyl 2-ethylhexyl (meth)acrylate, cyclohexyl (meth)acrylate, benzyl (meth)acrylate, and 2-hydroxyethyl (meth)acrylate; aromatic vinyl compounds such as styrene, vinyl toluene, and α-methylstyrene; N-substituted maleimides such as N-phenyl maleimide and N-cyclohexyl maleimide; butadiene or substituted butadiene compounds such as butadiene and isoprene; ethylene or substituted ethylene compounds such as ethylene, propylene, vinyl chloride, and acrylonitrile; and vinyl esters such as vinyl acetate. Among these, methyl (meth)acrylate, cyclohexyl (meth)acrylate, benzyl (meth)acrylate, and styrene are preferable, since favorable transparency is obtained and heat resistance is not easily deteriorated.

When the monomer for obtaining (a) the polymer contains other copolymerizable monomers, the content thereof is not specifically limited, but preferably 95% by mass or less, and more preferably 85% by mass or less, with respect to a total mass of the monomer component.

The weight average molecular weight of (a) the polymer is not specifically limited, but preferably from 2,000 to 200,000, more preferably from 5,000 to 100,000, and still more preferably from 5,000 to 20,000, from the viewpoints of the viscosity of the colored radiation-sensitive composition and heat resistance of a coating film formed from the composition.

When (a) the polymer contains an acidic group, the acid value thereof is preferably from 30 mgKOH/g to 500 mgKOH/g, and more preferably from 50 mgKOH/g to 400 mgKOH/g.

(a) The polymer may be easily obtained at least by polymerizing the monomer which essentially contains the ether dimer. Simultaneously with the polymerization, cyclization of the ether dimer occurs to form a tetrahydropyran ring structure.

The polymerization method used for synthesis of (a) the polymer is not specifically limited, and various known methods may be used. However, solvent polymerization is preferable. More specifically, for example, (a) the polymer may be synthesized according to the method for producing (a) a polymer as described in JP-A No. 204-300204.

Hereinbelow, exemplary compounds of (a) the polymer are shown, but the invention is not limited to them. The compositional ratio of the exemplary compounds described below is based on mol %.

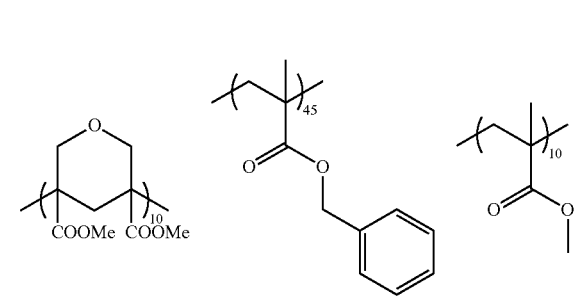

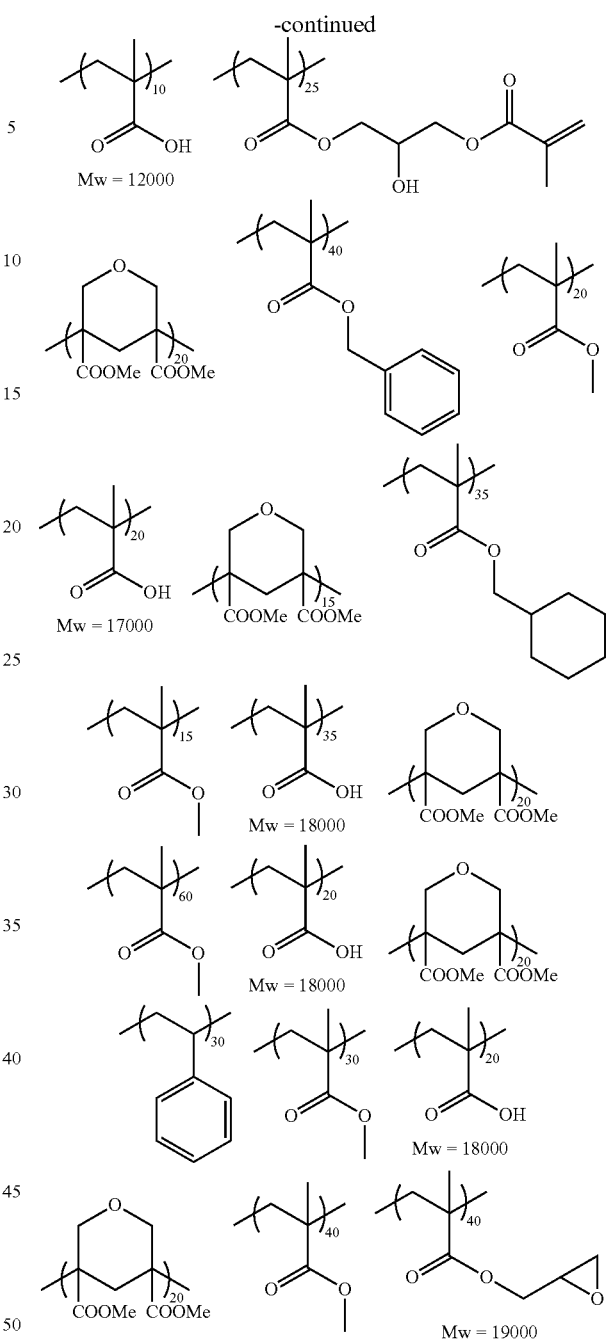

Among these alkali-soluble resins, a benzyl (meth)acrylate/(meth)acrylic acid copolymer and a multi-component copolymer of benzyl (meth)acrylate/(meth) acrylic acid/another monomer are preferable. Preferable examples of the alkali-soluble resins further include a copolymer of 2-hydroxyethyl methacrylate; and a 2-hydroxypropyl (meth)acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, and a 2-hydroxyethyl methacrylate/polystyrene macromonomer/benzyl methacrylate/methacrylic acid copolymer, such as those described in JP-A No. 7-140654.

The acid value of the alkali-soluble resin is preferably from 30 mgKOH/g to 200 mgKOH/g, more preferably from 50 mgKOH/g to 150 mgKOH/g, and still more preferably from 70 mgKOH/g to 120 mgKOH/g.

The weight average molecular weight (Mw) of the alkali-soluble resin is preferably from 2,000 to 50,000, more preferably from 5,000 to 30,000, and still more preferably from 7,000 to 20,000.

The content of (E) the alkali-soluble resin in the colored radiation-sensitive composition is preferably from 1% by mass to 15% by mass, more preferably from 2% by mass to 12% by mass, and still more preferably from 3% by mass to 10% by mass, with respect to a total solid content of the composition.

(F) Organic Solvent

The colored radiation-sensitive composition of the invention preferably contains (F) an organic solvent.

Examples of (F) the organic solvent include the followings.

Examples of (F) the organic solvent include esters, and specific examples thereof include ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate; alkyl oxyacetates such as a methyl oxyacetate, an ethyl oxyacetate, or a butyl oxyacetate (for example, methyl methoxyacetate, ethyl methoxyacetate, butyl methoxyacetate, methyl ethoxyacetate, and ethyl ethoxyacetate); alkyl 3-oxypropionates such as a methyl 3-oxypropionate or an ethyl 3-oxypropionate (for example, methyl 3-methoxypropionate, ethyl 3-methoxypropionate, methyl 3-ethoxypropionate, and ethyl 3-ethoxypropionate); alkyl 2-oxypropionates such as a methyl 2-oxypropionate, an ethyl 2-oxypropionate, or a propyl 2-oxypropionate (for example, methyl 2-methoxypropionate, ethyl 2-methoxypropionate, propyl 2-methoxypropionate, methyl 2-ethoxypropionate, and ethyl 2-ethoxypropionate); methyl 2-oxy-2-methylpropionates and ethyl 2-oxy-2-methylpropionates (for example, methyl 2-methoxy-2-methylpropionate and ethyl 2-ethoxy-2-methylpropionate); methyl pyruvate, ethyl pyruvate, propyl pyruvate, methyl acetoacetate, ethyl acetoacetate, methyl 2-oxobutanoate, and ethyl 2-oxobutanoate.

Examples of (F) the organic solvent include ethers, and specific examples thereof include diethylene glycol dimethyl ether, tetrahydrofuran, ethylene glycol monomethyl ether, ethylene glycol monoethyl ether, methyl cellosolve acetate, ethyl cellosolve acetate, ethyl carbitol acetate, butyl carbitol acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate.

Examples of (F) the organic solvent include ketones, and specific examples thereof include methyl ethyl ketone, cyclohexanone, 2-heptanone, and 3-heptanone.

Examples of (F) the organic solvent include aromatic hydrocarbons, and specific examples thereof include toluene and xylene.

These organic solvents may be used singly or in combination of two or more kinds thereof.

When two or more kinds of organic solvent are used in combination, the organic solvent is preferably a mixed solution of two or more solvents selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol monomethyl ether, or propylene glycol monomethyl ether acetate.

The content of (F) the organic solvent in the colored radiation-sensitive composition is preferably from 10% by mass to 90% by mass, more preferably from 20% by mass to 80% by mass, and still more preferably from 25% by mass to 75% by mass, with respect to a total mass of the colored radiation-sensitive composition.

Sensitizer

The colored radiation-sensitive composition of the invention may contain a sensitizer for the purpose of improving the efficiency of starting species generation of a polymerization initiator and shifting the photosensitive wavelength to a longer wavelength. Examples of the sensitizer include those capable of absorbing light in the wavelength region of from 300 nm to 450 nm.

Examples of the sensitizer include polynuclear aromatics such as phenanthrene, anthracene, pyrene, perylene, triphenylene, and 9,10-dialkoxyanthracene; xanthenes such as fluorescein, eosin, erythrosin, Rhodamine B, and Rose Bengal; thioxantones, cyanines, merocyanines, phthalocyanines; thiazines such as thionine, Methylene Blue, and toluidine blue; acridines, anthraquinones, squaryliums, coumarins, phenothiazines, phenazines, styrylbenzenes, azo compounds, diphenylmethanes, triphenylmethanes, distyrylbenzenes, carbazoles, porphyrin, spiro compounds, quinacridone compounds, indigo compounds, styryl compounds, pyrylium compounds, pyrromethene compounds, pyrazolotriazole compounds, benzothiazole compounds, barbituric acid derivatives, thiobarbituric acid derivatives; aromatic ketone compounds such as acetophenone, benzophenone, and Michler's ketone; and heterocyclic compounds such as N-aryloxazolidinone.

Chain Transfer Agent

It is preferable that the colored radiation-sensitive composition of the invention contains a chain transfer agent depending on the type of a photopolymerization initiator used. Examples of the chain transfer agent include alkyl esters of N,N-dialkyl amino benzoic acid and thiol compounds. Examples of the thiol compounds include 2-mercapto benzothiazole, 2-mercapto-1-phenyl benzimidazole, and 3-mercapto propionate. These thiol compounds may be used singly or in combination of two or more kinds thereof.

Polymerization Inhibitor

The colored radiation-sensitive composition of the invention may contain a small amount of a polymerization inhibitor for suppressing undesired thermal polymerization of a polymerizable compound during the production or storage of the colored radiation-sensitive composition.

Examples of the polymerization inhibitor usable in the invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and a primary cerium salt of N-nitrosophenylhydroxyamine. Among these, p-methoxyphenol is preferable.

The addition amount of the polymerization inhibitor is preferably from about 0.01% by mass to about 5% by mass, with respect to a total mass of the colored radiation-sensitive composition.

Substrate Adhesion Improver

The colored radiation-sensitive composition may further contain a substrate adhesion improver in order to improve the adhesiveness of the composition to a substrate.

Examples of the substrate adhesion improver include a silane coupling agent, a titanium coupling agent, and an aluminum coupling agent. Specific examples of the silane coupling agent include γ-methacryloxypropyltrimethoxysilane, γ-methacryloxypropyltriethoxysilane, γ-acrylooxypropyltrimethoxysilane, γ-acrylooxypropyltriethoxysilane, γ-mercaptopropyltrimethoxysilane, γ-aminopropyltriethoxysilane, and phenyltrimethoxysilane. Among these, γ-methacryloxypropyltrimethoxysilane is preferable as the substrate adhesion improver.

In order to prevent residue from remaining in an unexposed area after light exposure and development of the colored radiation-sensitive composition, the content of the substrate adhesion improver is preferably from 0.1% by mass to 30% by mass, more preferably from 0.5% by mass to 20% by mass, and still more preferably from 1% by mass to 10% by mass, with respect to a total solid content of the colored radiation-sensitive composition.

Surfactant

The colored radiation-sensitive composition of the invention may further contain a surfactant from the viewpoint of further improving the coatability. Various surfactants such as a fluorosurfactant, a nonionic surfactant, a cationic surfactant, an anionic surfactant, or a silicone surfactant may be used as the surfactant.

In particular, by incorporating a fluorosurfactant into the colored radiation-sensitive composition of the invention, the liquid properties (in particular, fluidity) of the composition when it is prepared as a coating liquid may be further improved, whereby uniformity in coating thickness and the liquid-saving properties are further improved.

That is, when a film is formed by using a coating liquid which is prepared by using a colored radiation-sensitive composition containing a fluorosurfactant, the interfacial tension between the surface to be coated and the coating solution liquid is lowered. As a result, wettability to the surface to be coated and coatability onto the surface to be coated are improved. Accordingly, even when a thin film having a thickness of approximately several micrometers is formed with a small amount of the coating liquid, the colored radiation-sensitive composition containing a fluorosurfactant is effective in that it can suitably form a film having uniform thickness in which unevenness in film thickness is suppressed.

The fluorine content in the fluorosurfactant is preferably from 3% by mass to 40% by mass, more preferably from 5% by mass to 30% by mass, and still more preferably from 7% by mass to 25% by mass. The fluorosurfactant having the fluorine content within the above ranges is effective in terms of the uniformity in thickness of the coating film or the liquid-saving properties, and has favorable solubility in the colored radiation-sensitive composition.

Examples of the fluorosurfactant include MEGAFAC F 171, MEGAFAC F 172, MEGAFAC F173, MEGAFAC F176, MEGAFAC F177, MEGAFAC F141, MEGAFAC F142, MEGAFAC F143, MEGAFAC F144, MEGAFAC R30, MEGAFAC F437, MEGAFAC F475, MEGAFAC F479, MEGAFAC F482, MEGAFAC F554, MEGAFAC F780, and MEGAFAC F781 (trade names, manufactured by DIC Corporation), FLUORAD FC430, FLUORAD FC431, and FLUORAD FC171 (trade names, manufactured by Sumitomo 3M Limited.), SURFLON S-382, SURFLON SC-101, SURFLON SC-103, SURFLON SC-104, SURFLON SC-105, SURFLON SC-1068, SURFLON SC-381, SURFLON SC-383, SURFLON 5393, and SURFLON KH-40 (trade names, manufactured by Asahi Glass Co., Ltd.).

Specific examples of the nonionic surfactant include glycerol, trimethylolpropane, trimethylolethane, and ethoxylates or propoxylates thereof (for example, glycerol propoxylate and glycerin ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (for example, PLURONIC L10, L31, L61, L62, 10R5, 17R2, and 25R2, and TETRONIC 304, 701, 704, 901, 904, and 150R1, (trade names, manufactured by BASF Corporation) and SOLSPERSE 20000 (trade name, manufactured by Lubrizol Corporation)).

Specific examples of the cationic surfactant include phthalocyanine derivatives such as EFKA-745 (trade name, manufactured by Morishita & Co., Ltd.), organosiloxane polymers such as KP341 (trade name, manufactured by Shin-Etsu Chemical Co., Ltd.), (meth)acrylic (co)polymers such as POLYFLOW No. 75, No. 90, and No. 95 (trade names, manufactured by Kyoeisha Chemical Co., Ltd.), and W001 (trade name, available from Yusho Co., Ltd.).

Specific examples of the anionic surfactant include W004, W005, and W017 (trade names, available from Yusho Co., Ltd.).

Examples of the silicone surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (trade names, manufactured by Dow Corning Toray Silicone Co., Ltd.), TSF-4440, TSF-4300, TSF-4445, TSF-4460, and TSF-4452 (trade names, manufactured by Momentive Performance Materials Inc.), KP341, KF6001, and KF6002 (trade name, manufactured by Shin-Etsu Silicone Co., Ltd.), and BYK307, BYK323, and BYK330 (trade names, manufactured by BYK Chemie).

These surfactants may be used singly or in a combination of two or more kinds thereof.

The amount of the surfactant to be added to the colored radiation-sensitive composition is preferably from 0.001% by mass to 2.0% by mass, and more preferably from 0.005% by mass to 1.0% by mass, with respect to a total mass of the colored radiation-sensitive composition.

Other Components

The colored radiation-sensitive composition of the invention may contain, if necessary, various additives including a chain transfer agent (such as N,N-dialkyl amino benzoic acid alkyl ester or 2-mercapto benzothiazole), a thermal polymerization initiator (such as an azo compound or a peroxide compound), a thermal polymerization component, a polyfunctional thiol or epoxy compound for improving strength and sensitivity of a film, a UV absorbing agent (such as alkoxy benzophenone), a plasticizer (such as dioctyl phthalate), an agent for improving developability (such as a low molecular weight organic carboxylic acid), other fillers, a polymer compound other than the specific binder and alkali soluble resin mentioned above, an anti-oxidant, and an anti-aggregation agent.

Moreover, in order to improve the curing efficiency of a film by post heating after development, a thermal curing agent may be added. Examples of the thermal curing agent include a thermal polymerization initiator such as an azo compound or peroxide; a Novolac resin, a resol resin, an epoxy compound, and a styrene compound.

In one embodiment, the total content of the colorants contained in the radiation-sensitive composition used for producing the color filter according to the invention is preferably from 20% by mass to 80% by mass, more preferably 25% by mass to 65% by mass, and still more preferably 30% by mass to 50% by mass, with respect to a total solid content of the radiation-sensitive composition of each color.

When the content of the colorants is within the above ranges, the obtained color filter exhibits favorable color reproducibility even in a thin film. Further, since the curing by radiation is fully progressed and thus strength of a cured colored film is maintained, narrowing of the latitude for development at the time of alkali development is prevented.

Method for Preparing Colored Radiation-Sensitive Composition

The colored radiation-sensitive composition according to the invention can be prepared by mixing and stirring respective components such as the colorant (in case of a pigment, a pigment dispersion is preferably prepared in advance and used), the photopolymerization initiator, the polymerizable compound, and optionally the UV absorbing agent, the alkali-soluble resin, and/or the surfactant, and if necessary, carrying out the filtration as described below.

The colored radiation-sensitive composition of the invention is preferably filtered by using a filter for the purpose of removing contaminants or reducing defects. Any filter may be used without specific limitation, as long as it is conventionally used for filtering purpose. Examples of the filter include a filter made of a fluororesin such as PTFE (polytetrafluoroethylene), a polyamide resin such as Nylon-6 or Nylon-6,6, and a polyolefin resin such as polyethylene or polypropylene (including high density resins and ultrahigh molecular weight resins). Among these, polypropylene (including high density polypropylene) is preferable.

The pore size of the filter is preferably from about 0.01 µm to about 7.0 µm, more preferably from about 0.01 µm to about 2.5 µm, and still more preferably from about 0.01 µm to about 2.0 µm. When the pore size is within the above ranges, complete removal of fine contaminants, which inhibit the production of homogeneous and uniform colored radiation-sensitive composition in a following process, can be achieved.

When the filter is used, a combination of different filters may be used. In such a case, filtering using a first filter may be carried out either once or two or more times.

Alternatively, plural first filters having different pore size within the above ranges may be used in combination. As used herein, the pore size may be determined with reference to the nominal value provided by the manufacturer of a filter. Commercially available filter may be selected from various filters provided by Japan Pall Corporation, Advantec Toyo Kaisha, Ltd., Entegris, Inc. (formerly, Japan Micro Labs), or KITZ MICROFILTER CORPORATION, for example.

As the second filter, those formed with the same material as the first filtering may be used.

For example, only a pigment dispersion may be filtered using the first filter, and the second filtering may be carried out after other components have been added to the filtered dispersion.

Production of Color Filter Using Colored Radiation-Sensitive Composition

The color filter according to the invention and the method for producing the color filter are described.

The color filter of the invention has, on a substrate, a colored region (that is, color pattern) obtained using the colored radiation-sensitive composition.

Hereinbelow, the color filter according to the invention is described in greater detail in view of the production method thereof (that is, method for producing the color filter of the invention).

The colored pixel of the color filter of the invention can be formed, for example, by a photolithography or inkjet method using the radiation-sensitive composition prepared as described above.

Among these, the photolithography method using the radiation-sensitive composition prepared as described above is preferable, since fine patterns can be easily formed into an arbitrary shape.

Hereinbelow, the method for producing a color filter for a solid-state image sensor is described, in which colored pixels of respective colors are formed by the photolithography method using the colored radiation-sensitive composition prepared as described above. However, the method for producing the color filter of the invention is not limited thereto.

The method for producing a color filter of the invention includes: a colored layer forming process of applying the colored radiation-sensitive composition described above to a surface of a substrate to form a colored radiation-sensitive composition layer (a colored layer); an exposure process of pattern-wise exposing the radiation-sensitive composition layer; and a development process of developing the colored radiation-sensitive composition layer after the exposure to form a colored pattern.

Colored Layer Forming Process

In the colored layer forming process, the colored radiation-sensitive composition is applied to a surface of a substrate, thereby forming a colored layer (a colored radiation-sensitive composition layer) from the colored radiation-sensitive composition.

Examples of the substrate that can be used for this process include photoelectric conversion device substrates or silicon substrates used for solid-state image sensors, CMOS, organic CMOS or the like; and alkali-free glass, soda glass, PYREX (registered trademark) glass, and quartz glass, and those glass substrates on which a transparent electroconductive film has been adhered, which are used for liquid crystal display devices or the like. A black matrix for separating pixels may be formed on these substrates. When needed, an undercoat layer may be formed on these substrates, for the purpose of improving the adhesion with upper layers, preventing material diffusion, or flattening the substrate surface.

Examples of the method for applying the colored radiation-sensitive composition to the substrate include various methods such as a slit coating method, ink jetting method, spin coating method, flow casting method, roll coating method, and screen printing method.

Drying (prebaking) of the colored layer (the colored radiation-sensitive composition layer) formed on the substrate may be conducted by heating at a temperature of from 50° C. to 140° C. for 10 sec to 300 sec using a hot plate, an oven or the like.

The film thickness of the colored layer after drying (prebaking) is from 0.55 µm to 1.8 µm, preferably from 0.60 µm to 1.8 µm, more preferably from 0.70 µm to 1.6 µm, and still more preferably from 0.80 µm to 1.4 µm, in view of securing favorable color density, and in view of reducing defects such as inability of light traveling in an oblique direction to reach a light-receiving portion and significant difference in light collecting efficiency between periheral and central regions of a device.

Exposure Process

In the exposure process, the colored layer (the colored radiation-sensitive composition layer) formed in the colored layer forming process is pattern-wise exposed.

In the exposure process, it is preferable that the colored layer is exposed to light through a photomask having a predetermined pattern, thereby curing only an area of the coating film that is irradiated with light. A radiation used in the exposure include radiation is preferably g-line, h-line, or i-line, and more preferably i-line. The irradiation intensity is preferably from 30 mJ/cm$^2$ to 1,500 mJ/cm$^2$, more preferably from 50 mJ/cm² to 1,000 mJ/cm², and still more preferably from 80 mJ/cm² to 500 mJ/cm².

Development Process

Subsequent to the exposure process, the alkali development treatment (the development process) is performed to elute an area, which has not been exposed to light in the exposure process, into a developer. Thereby, only an area that has been cured by light is left. As a result of the development process, a patterned film with colored pixels is formed.

The development system may be any of a dip system, a shower system, a spray system, or a puddle system, which may be combined with a swing system, a spin system, an ultrasonic system, or the like.

It is also possible to previously wet the surface to be developed with water or the like, before allowing the surface to contact with a developer, to prevent unevenness of development.

The developer is preferably an organic alkaline developer that dose not damage an underlying circuit. The development temperature is usually in a range of 20° C. to 30° C., and the development time may be in a range of 20 sec to 90 sec.

Examples of the alkaline agent contained in the developer include organic alkaline compounds such as aqueous ammonia, ethylamine, diethylamine, dimethylethanolamine, tetramethylammonium hydroxide, tetraethylammonium hydroxide, choline, pyrrole, piperidine, and 1,8-diazabicyclo-[5.4.0]-7-undecene; and inorganic compounds such as sodium hydroxide, potassium hydroxide, sodium hydrogen carbonate, and potassium hydrogen carbonate.

The developer is preferably an aqueous alkaline solution in which the above-mentioned alkali agent is diluted with pure water to a concentration of 0.001% by mass to 10% by mass, and preferably 0.01% by mass to 1% by mass. When the developer including an aqueous alkali solution is used, washing (rinsing) with pure water is generally performed to remove an excess developer followed by drying.

If necessary, in the production method of the invention, a curing process for curing the obtained colored pattern by post-heating (post-baking) or post-exposure may be carried out after carrying out the colored layer forming process, exposure process, and development process. The post-baking is heat treatment carried out after development for the purpose of completing curing, and the heat curing treatment is carried out typically at 100° C. to 270° C.

When light is used in the curing process, g-line, h-line, i-line, an excimer laser such as KrF or ArF, electronic beam, X-ray, or the like may be used. However, the curing process is preferably carried out at a low temperature such as 20° C. to 50° C. using a known high pressure mercury lamp. Radiation time is from 10 sec to 180 sec, and preferably 30 sec to 60 sec. When post-exposure and post heating are carried out in combination, it is preferable that post-exposure is performed first.

The color filter consisting of a desired number of hues can be manufactured by repeating the colored layer forming process, exposure process, and development process (and curing process, if necessary) several times in accordance with a desired number of hues.

Here, the color filter may be configured with a pixel having the specific spectral properties according to the invention alone. Alternatively, the color filter may be configured with a pixel having the specific spectral properties according to the invention together with at least one of a red, green, blue, magenta, yellow, cyan, black or colorless pixel. When the color filter is configured with a combination of a pixel having the specific spectral properties according to the invention and the pixel(s) of another color, the pixel having the specific spectral properties according to the invention may be formed before the formation of the pixel(s) of another color or may be formed after the formation of the pixel(s) of another color.

In the color filter of the invention, the cured composition in exposed area exhibits excellent adhesiveness to a substrate surface and excellent development resistance. Therefore, the adhesiveness between the obtained color pattern and a substrate is high, and the pattern has fine colored pixels with a desired cross sectional shape.

The colored radiation-sensitive composition of the invention can be easily cleaned and removed using a known cleaning liquid, even when the colored radiation-sensitive composition adheres to the nozzle or the piping portion of the coating device, or inside of the application device. In order to perform cleaning and removing more efficiently, the organic solvent described above as the solvent that may be contained in the colored radiation-sensitive composition is preferably used as a cleaning liquid.

Preferable examples of the cleaning liquid that can be used as a cleaning liquid for cleaning and removing the colored radiation-sensitive composition of the invention include those described in JP-A Nos. 7-128867, 7-146562, 8-278637, 2000-273370, 2006-85140, 2006-291191, 2007-2101, 2007-2102, and 2007-281523.

The cleaning liquid is preferably an alkylene glycol monoalkyl ether carboxylate or an alkylene glycol monoalkyl ether.

These organic solvents which may be used as a cleaning liquid may be used singly or in a combination of two or more kinds thereof.

When two or more kinds of organic solvent are used in combination, it is preferable to use a mixed solvent of an organic solvent that has a hydroxy group and an organic solvent that does not have a hydroxy group. The mass ratio of the organic solvent that has a hydroxy group and the organic solvent that does not have a hydroxy group (the solvent that has a hydroxy group/the solvent that does not have a hydroxy group) is from 1/99 to 99/1, preferably from 10/90 to 90/10, and more preferably from 20/80 to 80/20. The mixed solvent is preferably a mixed solvent of propyleneglycol monomethylether acetate (PGMEA) and propyleneglycol monomethyl ether (PGME) with a mixing ratio of PGMEA/PGME is 60/40.

In order to increase the permeability of the cleaning liquid into the colored radiation-sensitive composition, the cleaning liquid may contain a surfactant such as the above-described surfactant that may be contained in the colored radiation-sensitive composition The color filter of the invention that is produced by the method for producing the color filter of the invention is suitable for a solid-state image sensor such as a CCD sensor, a CMOS sensor, or an organic CMOS sensor, as well as an image display device such as an electronic paper display or an organic EL display, a liquid crystal display, and the like. In particular, the color filter of the invention is suitable for a solid-state image sensor such as a CCD sensor, a CMOS sensor, or an organic CMOS sensor with high resolution exceeding 1,000,000 pixels. The color filter of the invention is also useful as, for example, a color filter for a CCD device, in which the color filter is disposed between the light-receiving portion of each pixel and the microlens for condensing light.

Solid-State Image Sensor

The solid-state image sensor of the invention includes the color filter of the invention. The configuration of the solid-state image sensor of the invention is not specifically limited as long as it includes the color filter of the invention and functions as a solid-state image sensor. Examples configuration of the solid-state image sensor include the following.

That is, specific examples of the configuration of the solid-state image sensor include a configuration in which plural photodiodes and transfer electrodes (formed from polysilicon or the like), which form light-receiving areas of a solid-state image sensor (such as a CCD, CMOS, or organic CMOS sensor), are provided on a substrate, a light-shielding film (formed from tungsten or the like) is formed on the photodiodes and the transfer electrodes, with only light-receiving portions of photodiodes being left uncovered, a device protection film (formed from silicon nitride or the like) is provided on the light-shielding film so as to cover the entire surface of the light-shielding film and the light-receiving portions of photodiodes, and the color filter for a solid-state image sensor of the invention is disposed on the device protection film.

Furthermore, the configuration of the solid-state image sensor may be a configuration in which a light-condensing unit (for example, a micro lens or the like) is provided on the device protection film but under the color filter (the side nearer to the substrate), or a configuration in which a light-condensing unit (for example, a micro lens or the like) is provided on the color filter.

The organic CMOS sensor has a two-layer hybrid structure including a thin panchromatic photosensitive organic photoelectric conversion film as a photoelectric conversion layer and a CMOS signal read-out substrate, in which the organic material is responsible for trapping light and converting it into an electric signal and the inorganic material is responsible for outputting the electric signal. Therefore, in principle, the aperture ratio can be set at 100% compared to the incident light. The organic photoelectric conversion film can be overlaid on the CMOS signal read-out substrate as a structure-free continuous film without requiring any expensive fine processing, which is suitable for reducing the pixel size.

EXAMPLES

The invention is described more specifically below by reference to examples. In the description below, "part(s)" and "%" are based on mass unless indicated otherwise.

Preparation of Pigment Dispersion Y-1

A mixture having the following components was mixed and subjected to a dispersion treatment for 3 hours using a bead mill (a high pressure dispersing machine equipped with a pressure-reducing system, NANO-3000-10: trade name, manufactured by Beryu Co., Ltd.) using zirconia beads having a diameter of 0.3 mm, thereby obtaining a pigment dispersion Y-1.

| | |
|---|---|
| C.I. Pigment Yellow 139 | 15.8 parts |
| Dispersant: BYK-2001 (trade name, manufactured by BYK Chemie) | 3.6 parts |
| Resin 1: benzyl methacrylate/methacrylic acid copolymer (molar ratio of 70:30, Molecular weight: 30,000) | 4.3 parts |
| Organic solvent: propylene glycol monomethyl ether acetate | 76.3 parts |

Preparation of Pigment Dispersion Y-2

A mixture having the following components was mixed and subjected to a dispersion treatment for 3 hours using a bead mill (a high-pressure dispersing machine equipped with a pressure-reducing system, NANO-3000-10: trade name, manufactured by Beryu Co., Ltd.) using zirconia beads having a diameter of 0.3 mm, thereby obtaining a pigment dispersion Y-2.

| | |
|---|---|
| C.I. Pigment Yellow 150 | 15.8 parts |
| Dispersant: BYK-2001 (trade name, manufactured by BYK Chemie) | 3.6 parts |
| Resin 1: benzyl methacrylate/methacrylic acid copolymer (molar ratio of 70:30, Molecular weight: 30,000) | 4.3 parts |
| Organic solvent: propylene glycol monomethyl ether acetate | 76.3 parts |

Preparation of Pigment Dispersion V-1

A mixture having the following components was mixed and subjected to a dispersion treatment for 3 hours using a bead mill (a high-pressure dispersing machine equipped with a pressure-reducing system, NANO-3000-10: trade name, manufactured by Beryu Co., Ltd.) using zirconia beads having a diameter of 0.3 mm, thereby obtaining a pigment dispersion V-1.

| | |
|---|---|
| C.I. Pigment Violet 23 | 15.8 parts |
| Dispersant: BYK-2001 (trade name, manufactured by BYK Chemie) | 3.6 parts |
| Resin 1: benzyl methacrylate/methacrylic acid copolymer (molar ratio of 70:30, Molecular weight: 30000) | 4.3 parts |
| Organic solvent: propylene glycol monomethyl ether acetate | 76.3 parts |

Example 1

Preparation of Colored Radiation-Sensitive Composition

The following components were mixed to prepare a colored radiation-sensitive composition R-1.

| | |
|---|---|
| Pigment dispersion Y-1 | 16.9 parts |
| Pigment dispersion V-1 | 33.7 parts |
| Alkali-soluble resin: Resin 1 described above | 6.0 parts |
| Polymerizable compound 1: dipentaerythritol hexaacrylate (trade name: KAYARAD DPHA, manufactured by Nippon Kayaku Co., Ltd) | 3.8 parts |
| Polymerization initiator 1: a compound having the following structure (trade name: OXE-01, manufactured by BASF) | 1.1 parts |
| Ultraviolet absorber: Exemplary compound 1 | 0.6 parts |
| Organic solvent: propylene glycol monomethyl ether acetate | 37.9 parts |

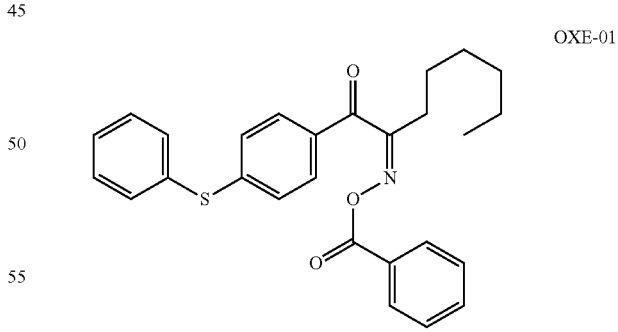

OXE-01

Examples 2 to 10 and Comparative Examples 1 to 4

The respective colored radiation-sensitive compositions of Examples 2 to 10 and Comparative Examples 1 to 4 were prepared in the same manner as the preparation of the colored radiation-sensitive composition of Example 1, except that the type and amount of the respective components were changed as shown in Tables 1 and 2.

Each of the colored radiation-sensitive compositions was evaluated for spectral characteristics. The results were summarized in Tables 1 and 2.

Spectral Characteristics

Each of the colored radiation-sensitive compositions was spin-coated on a glass substrate to have a film thickness after post-baking shown in Table 1, and the substrate was dried on a hot plate at 100° C. for 180 seconds. After drying, heating treatment (post-baking) was further performed on a hot plate at 200° C. for 300 seconds.

The spectral transmittance of the obtained substrate having colored pixels thereon was determined in the wavelength region of from 400 nm to 1000 nm using ultraviolet-visible-near-infrared spectrophotometer UV 3600 (trade name, manufactured by Shimadzu Corporation) using an uncoated glass substrate as reference.

The spectral transmittance in each of the obtained colored radiation-sensitive composition layers at 600 nm was approximately 30%.

Production of Color Filter

A photosensitive transparent composition CT-2010 (trade name, manufactured by Fujifilm Electronics Materials Co., Ltd) was uniformly applied onto an 8-inch silicon wafer using a spin-coater, thereby obtaining a coating film. The obtained coating film was heated in an oven at 220° C. for 60 minutes. The rotation number of the spin-coater for application was adjusted such that the film thickness of the coating film after heating was approximately 1 μm.

In this manner, a silicon wafer having an undercoat layer thereon was obtained.

The colored radiation-sensitive composition of Example 1 was applied onto the above-obtained silicon wafer having an undercoat layer thereon using a spin-coater so as to form a film having a dry thickness of 1.0 μm, and the film was then subjected to a heat treatment (prebaking) using a hot plate at 100° C. for 180 seconds.

Subsequently, pattern exposure of the obtained film was performed on a total of 399 points of the pattern arranged in a matrix form with 21 rows×19 columns using an i-line stepper FPA-3000i5+ (trade name, manufactured by Canon Inc.). In this case, the exposure on the 21 rows of the matrix was conducted under the condition that the minimum exposure quantity was set to 500 J/m² and the exposure dose was increased for each line at an interval of 500 J/m², whereas the exposure on the 19 columns was conducted under the condition that the focal length was changed at an interval of 0.1 μm from an optimum focal length value (Focus 0.0 μm) set as the center. That is, the focal length of a single column positioned at the center was set to the optimum focal length value and the focal length was changed for each adjacent line, and a photomask was used that allowed image formation such that square pixel patterns having a side length of 3 μm were arranged in a 4 mm×3 mm area.

Subsequently, the silicon wafer having the exposed coating film thereon was placed on a horizontal rotary table of a spin shower development machine (model DW-30, manufactured by Chemitronics, Co. Ltd) and subjected to paddle development at 23° C. for 60 seconds using CD-2060 (trade name, manufactured by Fujifilm Electronics Materials Co., Ltd) to form color patterns on the silicon wafer.

The silicon wafer having the color patterns thereon was rinsed with pure water and dried by spray-drying.

Furthermore, the silicon wafer was heated (post-baked) on a hot plate at 200° C. for 300 seconds, thereby obtaining a silicon wafer having colored pixels.

The respective color filters of Examples 2 to 10 and Comparative Examples 1 to 4 were produced in the same manner as the color filter of Example 1, except that each of the colored radiation-sensitive compositions of Examples 2 to 10 and Comparative Examples 1 to 4 was applied onto the silicon wafer having an undercoat layer thereon so as to form a film having a dry thickness shown in Tables 1 and 2.

Evaluation

Imaging Performance

The color filter thus produced was incorporated as a near-infrared filter in a solid-state image sensor according to a known method. Using the obtained solid-state image sensor, images were captured under a low illumination condition (0.001 Lux) to compare and evaluate imaging performances. The results are shown in Tables 1 and 2.

The evaluation criteria are as follows. Here, the criteria A, B and C are acceptable for practical use.

Evaluation Criteria

A: Favorable The subject can be clearly recognized on the image.

B: Quite good The subject can be recognized on the image.

C: Sufficient The subject can be almost recognized on the image.

D: Insufficient The subject cannot be recognized on the image.

Pattern Formability

The color patterns formed on the wafer were measured by a critical dimension SEM (scanning electron microscope S-9260 manufactured by Hitachi, Ltd) to evaluate the sizes of color patterns in the exposed area and the degree of a development residue in the unexposed area on the SEM images. It is preferable that the solubility in developer of the exposed area is different to that of the unexposed area, that images of the exposed area are formed in the exact size as per the mask design, and that undissolved residue does not remain in the unexposed area. The results are shown in Tables 1 and 2. The evaluation criteria are as follows. Here, the criteria A and B are acceptable for practical use.

Evaluation Criteria

A: an image having one-to-one correspondence with respect to the mask size was formed in the exposed area, while no undissolved residue was observed in the unexposed area, and a good rectangular pattern shape was observed.

B: an image having one-to-one correspondence with respect to the mask size was formed in the exposed area, while no undissolved residue was observed in the unexposed area.

C: a pattern was formed in the exposed area but the pattern was not an image having one-to-one correspondence with respect to the mask size, or a development defect was observed in the unexposed area.

D: the unexposed area was almost undissolved, and an image having one-to-one correspondence with respect to the mask size was not formed in the exposed area.

TABLE 1

|  |  | Ex. 1 | Ex. 2 | Ex. 3 | Ex. 4 | Ex. 5 | Ex. 6 | Ex. 7 |
|---|---|---|---|---|---|---|---|---|
| Component of composition | Polymerizable compound (DPHA) [parts] | 3.8 | 3.8 | 3.8 | 3.8 | 3.8 | 3.8 | 3.8 |

TABLE 1-continued

|  |  | Ex. 1 | Ex. 2 | Ex. 3 | Ex. 4 | Ex. 5 | Ex. 6 | Ex. 7 |
|---|---|---|---|---|---|---|---|---|
|  | Photopolymerization initiator (OXE-01) [parts] | 1.1 | 1.1 | 1.1 | 1.1 | 1.1 | 1.1 | 1.1 |
|  | Alkali-soluble resin (Resin 1) [parts] | 6.0 | 6.0 | 6.0 | 6.0 | 6.0 | 6.0 | 6.6 |
|  | UV absorber (Exemplary compound I) [parts] | 0.6 | 0.6 | 0.6 | 0.6 | 0.6 | 0.6 | — |
|  | Pigment dispersion Y-1 [parts] | 16.9 | 12.6 | 25.3 | 16.9 | 12.6 | 25.3 | — |
|  | Pigment dispersion Y-2 [parts] | — | — | — | — | — | — | 16.9 |
|  | Pigment dispersion V-1 [parts] | 33.7 | 38.0 | 25.3 | 33.7 | 38.0 | 25.3 | 33.7 |
|  | Propylene glycol monomethyl ether acetate [parts] | 37.9 | 37.9 | 37.9 | 37.9 | 37.9 | 37.9 | 37.9 |
|  | Pigment ratio [%] (A-1)/[(A-1) + (A-2)] | 33 | 25 | 50 | 33 | 25 | 50 | 33 |
| Characteristics of composition layer | Transmittance at 400 nm (T400) [%] | 8.1 | 12.4 | 3.5 | 17.3 | 13.4 | 8.2 | 8.1 |
|  | Transmittance at 550 nm (T550) [%] | 2.3 | 1.4 | 5.6 | 0.6 | 1.1 | 3.4 | 2.3 |
|  | Transmittance at 700 nm (T700) [%] | 91.3 | 90.7 | 92.7 | 89.4 | 90.3 | 92.2 | 91.3 |
|  | Wavelength resulting in 50% transmittance [nm] | 659 | 656 | 651 | 661 | 659 | 654 | 659 |
|  | Film thickness [μm] | 1.0 | 1.0 | 1.0 | 1.2 | 1.2 | 1.2 | 1.0 |
|  | Difference (T700 − T550) [%] | 89.1 | 89.2 | 87.1 | 88.7 | 89.2 | 88.9 | 89.1 |
| Evaluation | Imaging performance | A | A | A | A | A | A | B |
|  | Pattern formability | A | A | A | A | A | A | B |

Ex.: Example

TABLE 2

|  |  | Ex. 8 | Ex. 9 | Ex. 10 | Comp. Ex. 1 | Comp. Ex. 2 | Comp. Ex. 3 | Comp. Ex. 4 |
|---|---|---|---|---|---|---|---|---|
| Component of composition | Polymerizable compound (DPHA) [parts] | 3.8 | 3.8 | 3.1 | 3.1 | 3.1 | 3.1 | 3.1 |
|  | Photopolymerization initiator (OXE-01) [parts] | 1.1 | 1.1 | 0.9 | 0.9 | 0.9 | 0.9 | 0.9 |
|  | Alkali-soluble resin (Resin 1) [parts] | 6.6 | 6.6 | 0.6 | 0.6 | 0.6 | 0.6 | 0.6 |
|  | UV absorber (Exemplary compound I) [parts] | — | — | 0.6 | 0.6 | 0.6 | 0.6 | 0.6 |
|  | Pigment dispersion Y-1 [parts] | — | — | 19.0 | 14.6 | 6.3 | 51.8 | — |
|  | Pigment dispersion Y-2 [parts] | 12.6 | 25.3 | — | — | — | — | — |
|  | Pigment dispersion V-1 [parts] | 38.0 | 25.3 | 44.0 | 48.7 | 57.0 | 11.5 | 63.3 |
|  | Propylene glycol monomethyl ether acetate [parts] | 37.9 | 37.9 | 31.8 | 31.5 | 31.5 | 31.5 | 31.5 |
|  | Pigment ratio [%] (A-1)/[(A-1) + (A-2)] | 25 | 50 | 45 | 23 | 10 | 82 | 100 |
| Characteristics of composition layer | Transmittance in 400 nm (T400) [%] | 12.4 | 3.5 | 19.2 | 25.2 | 3.5 | 0.1 | 11.9 |
|  | Transmittance at 550 nm (T550) [%] | 1.4 | 5.6 | 6.8 | 5.0 | 0.0 | 7.3 | 0.0 |
|  | Transmittance at 700 nm (T700) [%] | 90.7 | 92.7 | 93.8 | 93.4 | 75.8 | 91.9 | 74.1 |
|  | Wavelength resulting in 50% transmittance [nm] | 656 | 651 | 650 | 652 | 680 | 649 | 649 |
|  | Film thickness [μm] | 1.0 | 1.0 | 0.55 | 0.55 | 2.00 | 2.00 | 2.00 |
|  | Difference (T700 − T550) [%] | 89.2 | 87.1 | 87.0 | 88.3 | 75.8 | 84.6 | 74.1 |

TABLE 2-continued

|  |  | Ex. 8 | Ex. 9 | Ex. 10 | Comp. Ex. 1 | Comp. Ex. 2 | Comp. Ex. 3 | Comp. Ex. 4 |
|---|---|---|---|---|---|---|---|---|
| Evaluation | Imaging performance | B | B | B | C | C | C | D |
|  | Pattern formability | B | B | A | B | C | C | C |

Ex.: Example;
Comp. Ex.: Comparative Example

It is shown that all of Examples 1 to 10 using the colored radiation-sensitive compositions of the invention exhibit favorable image quality at a low illumination level and are therefore suitable as a composition for a near-infrared filter. Furthermore, it is shown that Examples 1 to 10 exhibit good pattern formability.

The disclosure of Japanese Patent Application No. 2011-200624 is incorporated herein by reference in its entirety.

All publications, patent applications, and technical standards mentioned in this specification are herein incorporated by reference to the same extent as if each individual publication, patent application, or technical standard was specifically and individually indicated to be incorporated by reference.

What is claimed is:

1. A colored radiation-sensitive composition for a color filter, comprising (A) a pigment, (B) a photopolymerization initiator, and (C) a polymerizable compound, and (D) an ultraviolet absorber,
    wherein the total content of (A) the pigment is from 5% by mass to 50% by mass with respect to the total solids content of the colored radiation-sensitive composition, and
    wherein the colored radiation-sensitive composition satisfies the following conditions:
    when a colored radiation-sensitive composition layer is formed from the colored radiation-sensitive composition such that spectral transmittance at 600 nm becomes 30%, the colored radiation-sensitive composition layer comprises the following characteristics:
    (1) spectral transmittance at 400 nm is 20% or less;
    (2) spectral transmittance at 550 nm is 10% or less;
    (3) spectral transmittance at 700 nm is 70% or more;
    (4) a wavelength resulting in 50% spectral transmittance is in a range of from 650 nm to 680 nm; and
    (5) a film thickness of the colored radiation-sensitive composition layer is in a range of from 0.55 µm to 1.8 µm.

2. The colored radiation-sensitive composition for a color filter according to claim 1, wherein when a colored radiation-sensitive composition layer is formed from the colored radiation-sensitive composition such that spectral transmittance at 600 nm becomes 30%, the colored radiation-sensitive composition layer further comprises the following characteristic:
    (6) a difference between spectral transmittance at 700 nm (T700) and spectral transmittance at 550 nm (T550) in the colored radiation-sensitive composition layer is 75% or more.

3. The colored radiation-sensitive composition for a color filter according to claim 1, wherein (A) the pigment comprises (A-1) at least one of an azo yellow pigment or an isoindoline yellow pigment and (A-2) a dioxazine violet pigment.

4. The colored radiation-sensitive composition for a color filter according to claim 3, wherein the content of (A-1) the at least one of an azo yellow pigment or an isoindoline yellow pigment is from 25% by mass to 50% by mass with respect to the total content of (A-1) the at least one of an azo yellow pigment or an isoindoline yellow pigment and (A-2) the dioxazine violet pigment.

5. The colored radiation-sensitive composition for a color filter according to claim 4,
    wherein the content of (A-1) the at least one of an azo yellow pigment or an isoindoline yellow pigment is from 30% by mass to 40% by mass with respect to the total content of (A-1) the at least one of an azo yellow pigment or an isoindoline yellow pigment and (A-2) the dioxazine violet pigment.

6. The colored radiation-sensitive composition for a color filter according to claim 1, wherein the content of (D) the ultraviolet absorber is from 0.01% by mass to 10% by mass with respect to the total solids content of the colored radiation-sensitive composition.

7. The colored radiation-sensitive composition for a color filter according to claim 6, wherein (D) the ultraviolet absorber is a compound represented by the following Formula (I):

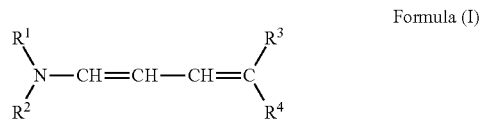

Formula (I)

wherein, in Formula (I), $R^1$ and $R^2$ each independently represent a hydrogen atom, an alkyl group having 1 to 20 carbon atoms, or an aryl group having 6 to 20 carbon atoms, $R^1$ and $R^2$ may be the same as or different from each other, but $R^1$ and $R^2$ do not simultaneously represent a hydrogen atom; and $R^3$ and $R^4$ represent an electron withdrawing group.

8. The colored radiation-sensitive composition for a color filter according to claim 6, further comprising (E) an alkali-soluble resin.

9. The colored radiation-sensitive composition for a color filter according to claim 8, wherein the content of (E) the alkali-soluble resin in the colored radiation-sensitive composition is from 1% by mass to 15% by mass with respect to the total mass of the colored radiation-sensitive composition.

10. The colored radiation-sensitive composition for a color filter according to claim 8, further comprising (F) an organic solvent.

11. The colored radiation-sensitive composition for a color filter according to claim 10, wherein the content of (F) the organic solvent in the colored radiation-sensitive composition is from 10% by mass to 90% by mass with respect to the total mass of the colored radiation-sensitive composition.

12. A method for forming a pattern, the method comprising:
    applying the colored radiation-sensitive composition according to claim 1 onto a substrate to form a colored radiation-sensitive composition layer;

subjecting the colored radiation-sensitive composition layer to pattern exposure; and developing the colored radiation-sensitive composition layer after the pattern exposure.

13. A color filter comprising a color film formed using the colored radiation-sensitive composition according to claim 1.

14. A solid-state image sensor comprising the color filter according to claim 13.

15. A method for producing a color filter, the method comprising:

applying the colored radiation-sensitive composition according to claim 1 onto a substrate to form a colored radiation-sensitive composition layer;

subjecting the colored radiation-sensitive composition layer to pattern exposure; and developing the colored radiation-sensitive composition layer after the pattern exposure to form a color pattern.

16. The colored radiation-sensitive composition for a color filter according to claim 1, wherein (B) the photopolymerization initiator comprises an oxime compound.

17. The colored radiation-sensitive composition for a color filter according to claim 1, wherein the mass ratio of (D) the ultraviolet absorber with respect to (B) the photopolymerization initiator is from 0.3 to 1.1.

18. The colored radiation-sensitive composition for a color filter according to claim 1, wherein (C) the polymerizable compound contains at least four terminal ethylenically unsaturated bonds.

19. The colored radiation-sensitive composition for a color filter according to claim 1, wherein the total content of (A) the pigment is from 8% by mass to 45% by mass with respect to the total solids content of the colored radiation-sensitive composition.

20. The colored radiation-sensitive composition for a color filter according to claim 1, wherein when a colored radiation-sensitive composition layer is formed from the colored radiation-sensitive composition such that spectral transmittance at 600 nm becomes 30%, the colored radiation-sensitive composition layer comprises the following characteristic:

(5) a film thickness of the colored radiation-sensitive composition layer is in a range of from 0.7 μm to 1.6 μm.

21. The colored radiation-sensitive composition for a color filter according to claim 1, wherein when a colored radiation-sensitive composition layer is formed from the colored radiation-sensitive composition such that spectral transmittance at 600 nm becomes 30%, the colored radiation-sensitive composition layer comprises the following characteristic:

(5) a film thickness of the colored radiation-sensitive composition layer is in a range of from 0.8 μm to 1.4 μm.

22. A color film formed using the colored radiation-sensitive composition according to claim 1.

23. The color film according to claim 22, wherein the film thickness of the color film is in a range of from 0.70 μm to 1.6 μm.

24. The color film according to claim 22, wherein the film thickness of the color film is in a range of from 0.80 μm to 1.4 μm.

25. A colored radiation-sensitive composition for a color filter, comprising (A) a pigment, (B) a photopolymerization initiator, and (C) a polymerizable compound, wherein:

the total content of (A) the pigment is from 5% by mass to 50% by mass with respect to the total solids content of the colored radiation-sensitive composition;

(B) the photopolymerization initiator comprises an oxime compound; and the colored radiation-sensitive composition satisfies the following conditions:

when a colored radiation-sensitive composition layer is formed from the colored radiation-sensitive composition such that spectral transmittance at 600 nm becomes 30%, the colored radiation-sensitive composition layer comprises the following characteristics:

(1) spectral transmittance at 400 nm is 20% or less;

(2) spectral transmittance at 550 nm is 10% or less;

(3) spectral transmittance at 700 nm is 70% or more;

(4) a wavelength resulting in 50% spectral transmittance is in a range of from 650 nm to 680 nm; and (5) a film thickness of the colored radiation-sensitive composition layer is in a range of from 0.55 μm to 1.8 μm.

26. The colored radiation-sensitive composition for a color filter according to claim 25, wherein (A) the pigment comprises (A-1) at least one of an azo yellow pigment or an isoindoline yellow pigment and (A-2) a dioxazine violet pigment, wherein the content of (A-1) the at least one of an azo yellow pigment or an isoindoline yellow pigment is from 25% by mass to 50% by mass with respect to the total content of (A-1) the at least one of an azo yellow pigment or an isoindoline yellow pigment and (A-2) the dioxazine violet pigment.

27. The colored radiation-sensitive composition for a color filter according to claim 25, wherein the total content of (A) the pigment is from 8% by mass to 45% by mass with respect to the total solids content of the colored radiation-sensitive composition.

28. The colored radiation-sensitive composition for a color filter according to claim 25, wherein when a colored radiation-sensitive composition layer is formed from the colored radiation-sensitive composition such that spectral transmittance at 600 nm becomes 30%, the colored radiation-sensitive composition layer comprises the following characteristic:

(5) a film thickness of the colored radiation-sensitive composition layer is in a range of from 0.7 μm to 1.6 μm.

29. The colored radiation-sensitive composition for a color filter according to claim 25, wherein when a colored radiation-sensitive composition layer is formed from the colored radiation-sensitive composition such that spectral transmittance at 600 nm becomes 30%, the colored radiation-sensitive composition layer comprises the following characteristic:

(5) a film thickness of the colored radiation-sensitive composition layer is in a range of from 0.8 μm to 1.4 μm.

30. A color film formed using the colored radiation-sensitive composition according to claim 25.

31. The color film according to claim 30, wherein the film thickness of the color film is in a range of from 0.70 μm to 1.6 μm.

32. The color film according to claim 30, wherein the film thickness of the color film is in a range of from 0.80 μm to 1.4 μm.

* * * * *